US012751165B2

(12) United States Patent
Choi et al.

(10) Patent No.: US 12,751,165 B2
(45) Date of Patent: Sep. 29, 2026

(54) DISPLAY APPARATUS

(71) Applicant: Samsung Display Co., Ltd., Yongin-si (KR)

(72) Inventors: Jonghyun Choi, Yongin-si (KR); Changsoo Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 365 days.

(21) Appl. No.: 18/544,317

(22) Filed: Dec. 18, 2023

(65) Prior Publication Data

US 2024/0324350 A1 Sep. 26, 2024

(30) Foreign Application Priority Data

Mar. 24, 2023 (KR) ........................ 10-2023-0038990
Apr. 17, 2023 (KR) ........................ 10-2023-0050247

(51) Int. Cl.
*H10K 59/121* (2023.01)
*H10K 59/131* (2023.01)
*H10K 59/123* (2023.01)
*H10K 102/10* (2023.01)

(52) U.S. Cl.
CPC ....... *H10K 59/131* (2023.02); *H10K 59/1216* (2023.02); *H10K 59/123* (2023.02); *H10K 2102/103* (2023.02)

(58) Field of Classification Search
CPC ......................... H10K 59/1216; H10K 59/123
See application file for complete search history.

(56) References Cited

U.S. PATENT DOCUMENTS

| | | | | |
|---|---|---|---|---|
| 7,855,758 | B2 | 12/2010 | Kim et al. | |
| 9,620,613 | B2 | 4/2017 | Park et al. | |
| 9,660,010 | B2 | 5/2017 | Park et al. | |
| 11,387,312 | B2 | 7/2022 | Cho et al. | |
| 2018/0033847 | A1* | 2/2018 | Kim | H10D 86/0231 |
| 2021/0057458 | A1 | 2/2021 | Kim et al. | |
| 2022/0173184 | A1* | 6/2022 | Jeong | H10K 59/1213 |
| 2022/0199724 | A1* | 6/2022 | Yoon | H10K 59/1216 |
| 2022/0254849 | A1* | 8/2022 | Lee | H10K 59/1213 |

FOREIGN PATENT DOCUMENTS

| | | | |
|---|---|---|---|
| CN | 111312796 | A | 6/2020 |
| CN | 111725287 | A | 9/2020 |
| CN | 112530977 | A | 3/2021 |
| KR | 10-1479995 | B1 | 1/2015 |

(Continued)

*Primary Examiner* — Michele Fan
(74) *Attorney, Agent, or Firm* — Womble Bond Dickinson (US) LLP

(57) ABSTRACT

A display apparatus including: a substrate; a first semiconductor layer on the substrate; a first gate layer on the first semiconductor layer; a second gate layer on the first gate layer; a second semiconductor layer on the second gate layer; a third gate layer on the second semiconductor layer; a 1-1$^{st}$ transparent electrode layer on a same layer as the second gate layer; and a 1-2$^{nd}$ transparent electrode layer on a same layer as the third gate layer and overlapping at least a portion of the 1-1$^{st}$ transparent electrode layer in a plan view.

20 Claims, 16 Drawing Sheets

(56) References Cited

FOREIGN PATENT DOCUMENTS

| | | | |
|---|---|---|---|
| KR | 10-2016-0015433 | A | 2/2016 |
| KR | 10-2020-0045102 | A | 5/2020 |
| KR | 10-2021-0022808 | A | 3/2021 |
| KR | 10-2236381 | B1 | 4/2021 |
| KR | 10-2021-0101378 | A | 8/2021 |
| KR | 10-2022-0115709 | A | 8/2022 |

* cited by examiner

DISPLAY APPARATUS

CROSS-REFERENCE TO RELATED APPLICATION

The present application claims priority to and the benefit of Korean Patent Application No. 10-2023-0038990, filed on Mar. 24, 2023, and Korean Patent Application No. 10-2023-0050247, filed on Apr. 17, 2023, in the Korean Intellectual Property Office, the entire disclosure of each of which is incorporated herein by reference.

BACKGROUND

1. Field

Aspects of one or more embodiments relate to display apparatuses.

2. Description of Related Art

Display apparatuses receive information about an image and display the image. Such display apparatuses are used as displays of small products, such as mobile phones, or as displays of large products, such as televisions.

A display apparatus includes a plurality of pixels that receive electrical signals and emit light to display an image to the outside. Each of the plurality of pixels includes a light-emitting device. For example, in the case of organic light-emitting display apparatuses, each pixel includes an organic light-emitting diode (OLED) as a light-emitting device. In general, an organic light-emitting display apparatus includes a thin film transistor and an organic light emitting diode, which is a display element, formed on a substrate, and the organic light emitting diode emits light by itself.

Research into increasing the transmittance of a pixel circuit in the case where a high-resolution display apparatus includes an organic light-emitting diode has been continuously conducted.

The above information disclosed in this Background section is only for enhancement of understanding of the background and therefore the information discussed in this Background section does not necessarily constitute prior art.

SUMMARY

Aspects of one or more embodiments relate to display apparatuses, and for example, to a display apparatus having relatively improved transmittance.

One or more embodiments include a display apparatus having relatively improved transmittance. However, aspects of embodiments according to the present disclosure are not limited thereto, and the above characteristics do not limit the scope of embodiments according to the disclosure.

Additional aspects will be set forth in portion in the description which follows and, in part, will be apparent from the description, or may be learned by practice of the presented embodiments of the disclosure.

According to one or more embodiments, a display apparatus includes a substrate, a first semiconductor layer arranged on the substrate, a first gate layer arranged on the first semiconductor layer, a second gate layer arranged on the first gate layer, a second semiconductor layer arranged on the second gate layer, a third gate layer arranged on the second semiconductor layer, a 1-1$^{st}$ transparent electrode layer on a same layer as the second gate layer, and a 1-2$^{nd}$ transparent electrode layer on a same layer as the third gate layer and overlapping at least a portion of the 1-1$^{st}$ transparent electrode layer in a plan view.

The display apparatus may further include a first conductive layer arranged on the third gate layer, a second conductive layer arranged on the first conductive layer, and a 1-3$^{rd}$ transparent electrode layer on a same layer as the second conductive layer.

In a plan view, the 1-3$^{rd}$ transparent electrode layer may overlap at least a portion of the 1-1$^{st}$ transparent electrode layer and at least a portion of the 1-2$^{nd}$ transparent electrode layer.

Light radiated from a bottom of the substrate toward a top of the substrate may be simultaneously transmitted by the 1-1$^{st}$ transparent electrode layer, the 1-2$^{nd}$ transparent electrode layer and the 1-3$^{rd}$ transparent electrode layer.

The display apparatus may further include a first capacitor unit including a 1-1$^{st}$ electrode and a 1-2$^{nd}$ electrode insulated from the 1-1$^{st}$ electrode, wherein the 1-1$^{st}$ electrode is a portion of the 1-3$^{rd}$ transparent electrode layer, and the 1-2$^{nd}$ electrode is a portion of the second semiconductor layer.

The display apparatus may further include a 1-4th transparent electrode layer on a same layer as the second gate layer and spaced apart from the 1-1$^{st}$ transparent electrode layer on the same plane.

The display apparatus may further include a first conductive layer arranged on the third gate layer, a second conductive layer arranged on the first conductive layer, and a 1-5th transparent electrode layer on a same layer as the first conductive layer.

When viewed in the direction perpendicular to the substrate, the 1-5$^{th}$ transparent electrode layer may overlap at least a portion of the 1-4$^{th}$ transparent electrode layer.

Light radiated from a bottom of the substrate toward a top of the substrate may be simultaneously transmitted by the 1-4$^{th}$ transparent electrode layer and the 1-5$^{th}$ transparent electrode layer.

The display apparatus may further include a second capacitor unit including a 2-1$^{st}$ electrode and a 2-2$^{nd}$ electrode insulated from the 2-1$^{st}$ electrode, wherein the 2-1$^{st}$ electrode is a portion of the 1-4$^{th}$ transparent electrode layer, and the 2-2$^{nd}$ electrode is a portion of the first gate layer.

According to one or more embodiments, a display apparatus includes a substrate, a first semiconductor layer arranged on the substrate, a first gate layer arranged on the first semiconductor layer, a second gate layer arranged on the first gate layer, a second semiconductor layer arranged on the second gate layer, a third gate layer arranged on the second semiconductor layer, a 2-1$^{st}$ transparent electrode layer on a same layer as the third gate layer and overlapping a portion of the second semiconductor layer when viewed in the direction perpendicular to the substrate, and a first capacitor unit including a 1-1$^{st}$ electrode and a 1-2$^{nd}$ electrode insulated from the 1-1$^{st}$ electrode, wherein the 1-1$^{st}$ electrode is at least a portion of the 2-1$^{st}$ transparent electrode layer, and the 1-2$^{nd}$ electrode is a portion of the second semiconductor layer.

The display apparatus may further include a first conductive layer arranged on the third gate layer, a second conductive layer arranged on the first conductive layer, and a 2-2$^{nd}$ transparent electrode layer on a same layer as the second conductive layer and overlapping at least a portion of the 2-1$^{st}$ transparent electrode layer when viewed in the direction perpendicular to the substrate.

The display apparatus may further include a 2-3$^{rd}$ transparent electrode layer on a same layer as the second gate layer and overlapping at least a portion of the 2-1$^{st}$ transparent electrode layer when viewed in the direction perpendicular to the substrate.

Light radiated from a bottom of the substrate toward a top of the substrate may be simultaneously transmitted by the 2-1$^{st}$ transparent electrode layer and the 2-2$^{nd}$ transparent electrode layer.

The light radiated from the bottom of the substrate toward the top of the substrate may be simultaneously transmitted by the 2-1$^{st}$ transparent electrode layer and the 2-3$^{rd}$ transparent electrode layer.

The display apparatus may further include a 2-4$^{th}$ transparent electrode layer on a same layer as the second gate layer and spaced apart from the 2-3$^{rd}$ transparent electrode layer on the same plane.

The display apparatus may further include a second capacitor unit including a 2-1$^{st}$ electrode and a 2-2$^{nd}$ electrode insulated from the 2-1$^{st}$ electrode, wherein the 2-2$^{nd}$ electrode is a portion of the 2-4$^{th}$ transparent electrode layer, and the 2-2$^{nd}$ electrode is a portion of the first gate layer.

According to one or more embodiments, a display apparatus includes a substrate, a first semiconductor layer arranged on the substrate, a first gate layer arranged on the first semiconductor layer, a second gate layer arranged on the first gate layer, a second semiconductor layer arranged on the second gate layer, a third gate layer arranged on the second semiconductor layer, a 3-1$^{st}$ transparent electrode layer on a same layer as the second gate layer and overlapping a portion of the second semiconductor layer when viewed in the direction perpendicular to the substrate, and a third capacitor unit including a 3-1$^{st}$ electrode and a 3-2$^{nd}$ electrode insulated from the 3-1$^{st}$ electrode, wherein the 3-1$^{st}$ electrode is at least a portion of the 3-1$^{st}$ transparent electrode layer, and the 3-2$^{nd}$ electrode is a portion of the second semiconductor layer.

The display apparatus may further include a first conductive layer arranged on the third gate layer, a second conductive layer arranged on the first conductive layer, and a 3-2$^{nd}$ transparent electrode layer on a same layer as the second conductive layer and overlapping at least a portion of the 3-1$^{st}$ transparent electrode layer when viewed in the direction perpendicular to the substrate.

The display apparatus may further include a 3-3$^{rd}$ transparent electrode layer on a same layer as the third gate layer and overlapping at least a portion of the 3-2$^{nd}$ transparent electrode layer when viewed in the direction perpendicular to the substrate.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
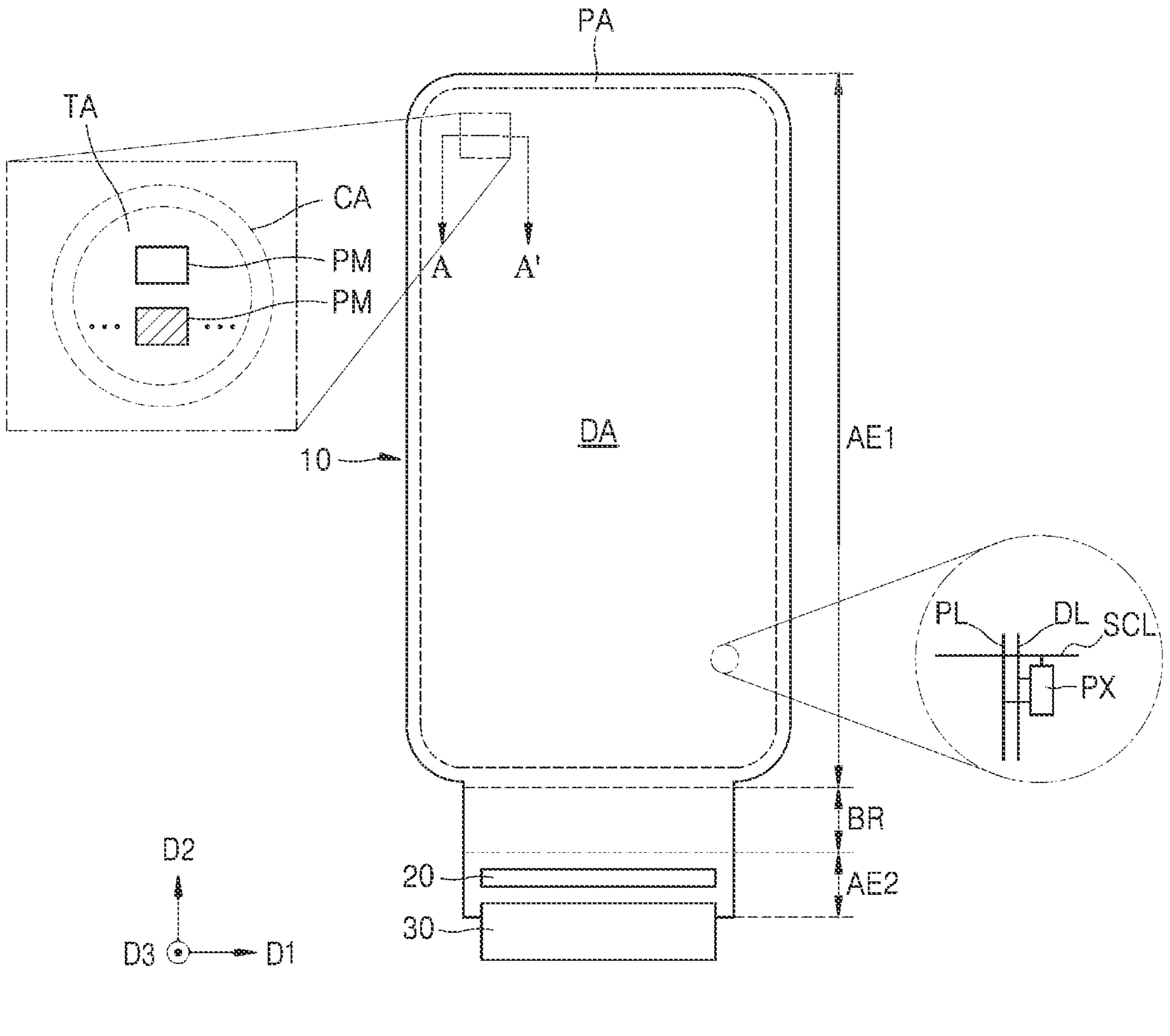
FIG. 1 is a schematic plan view of a portion of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term “and/or” includes any and all combinations of one or more of the associated listed items. Throughout the disclosure, the expression “at least one of a, b or c” indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Hereinafter, effects and features of the disclosure and a method for accomplishing them will be described more fully with reference to the accompanying drawings, in which embodiments of the present disclosure are shown. The disclosure may, however, be embodied in many different forms and should not be construed as limited to the embodiments set forth herein.

One or more embodiments will be described below in more detail with reference to the accompanying drawings. Those components that are the same as or are in correspondence with each other are rendered the same reference numeral regardless of the figure number, and redundant explanations are omitted.

It will be understood that, unless otherwise specified, when an element such as a layer, film, region or substrate is referred to as being “on” another element, it can be “directly” on the other element or intervening elements may also be present. In the drawings, the thicknesses of layers and regions are exaggerated or reduced for convenience of explanation. For example, since sizes and thicknesses of components in the drawings are arbitrarily illustrated for convenience of explanation, embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

A display apparatus according to some embodiments will be described in more detail based on the above-described matters.

FIG. 1 is a schematic plan view of a portion of a display apparatus according to some embodiments.

As illustrated in FIG. 1, the display apparatus according to some embodiments includes a display panel 10. The display apparatus may be of any type as long as it includes the display panel 10. For example, the display apparatus may be any one of various products such as smartphones, tablets, laptops, televisions, or billboards.

The display panel 10 includes a display area DA and a peripheral area PA around the display area DA. The display area DA is an area for displaying an image. A plurality of main pixels PX may be arranged in the display area DA. When viewed in a direction approximately perpendicular to the display apparatus 10 (e.g., in a direction normal or perpendicular to a display surface of the display area DA, or in a plan view), the display area DA may have any of various shapes such as a circular shape, an oval shape, a polygonal shape, and a particular figure shape, with or without rounded corners. FIG. 1 illustrates embodiments where the display area DA has a substantially rectangular shape with rounded corners.

The peripheral area PA may be arranged outside the display area DA. A width (in an x-axis direction) of a portion of the peripheral area PA may be less than a width (in the x-axis direction) of the display area DA. Due to this structure, a portion of the peripheral area PA may be easily bent, as will be described in more detail later.

Because the display panel 10 includes a substrate 100 of FIG. 2 or subsequent drawings, which will be described in more detail later, it may be considered that the substrate 100 has the display area DA and the peripheral area PA. For convenience of explanation, the substrate 100 will now be described as having the display area DA and the peripheral area PA.

The display panel 10 may also be considered as including a main region AE1, a bending region BR outside the main region AE1, and a subregion AE2 located opposite the main region AE1 with respect to the bending region BR. As illustrated in FIG. 2, the display panel 10 may be bent in the bending region BR such that a portion of the subregion AE2 may overlap the main region AE2 as viewed in a z-axis direction. However, the disclosure is not limited to a bent display apparatus, and may also be applied to an unbent display apparatus. The subregion AE2 may be a non-display area or may include a non-display area, as will be described later. By allowing the display panel 10 to be bent in the bending region BR, the non-display area may not be viewed when the display apparatus is viewed from the front (in a −z direction) or the size of viewed area of the non-display area may be minimized even when it is viewed.

A driving chip 20 may be arranged in the subregion AE2 of the display panel 10. The driving chip 20 may include an integrated circuit for driving the display panel 10. The integrated circuit may be a data driving integrated circuit for generating a data signal; however, embodiments according to the present disclosure are not limited thereto.

The driving chip 20 may be mounted in the subregion AE2 of the display panel 10. The driving chip 20 may be mounted on the same surface as the display surface of the display area DA; however, as the display panel 10 is bent in the bending region BR as described above, the driving chip 20 may be located on a rear surface of the main region AE1.

A printed circuit board (PCB) 30 or the like may be attached to an end of the subregion AE2 of the display panel 10. The printed circuit board 30 or the like may be electrically connected to the driving chip 20 or the like through a pad on a substrate.

An organic light-emitting display apparatus will now be illustrated and described as a display apparatus according to some embodiments, but a display apparatus of the disclosure is not limited thereto. According to some embodiments, the display apparatus of the disclosure may be an inorganic light-emitting display, a quantum dot light-emitting display, or the like. For example, an emission layer of a display device included in the display apparatus may include an organic material or may include an inorganic material. The display apparatus may include an emission layer, and a quantum dot layer located on the path of light emitted by the emission layer.

The display area DA may be an area for displaying an image, and a plurality of main pixels PX may be arranged in the display area DA. Each of the main pixels PX may include a display element such as an organic light-emitting diode. Each of the main pixels PX may emit, for example, red light, green light, blue light, or white light. The main pixel PX may be connected to a pixel circuit including a thin film transistor (TFT), a storage capacitor, etc. Such a pixel circuit may be connected to, for example, a scan line SCL that transmits a scan signal, a data line DL that intersects with the scan line SCL and transmits a data signal, and a driving voltage line PL that supplies a driving voltage. The scan line SCL may extend in the x direction, and the data line DL and the driving voltage line PL may each extend in the y direction.

The main pixel PX may emit light having a luminance corresponding to an electrical signal from an electrically connected pixel circuit. The display area DA may display a certain image by using light emitted by the main pixel PX. For reference, the main pixel PX used herein may be defined as a light-emission area that emits one of red light, green light, and blue light as described above.

The plurality of main pixels PX may be electrically connected to the outer circuits located in the peripheral area PA. A scan driving circuit, an emission control driving circuit, a terminal, a driving power supply wire, an electrode power supply wire, and the like may be located in the peripheral area PA. The scan driving circuit may provide a scan signal to a pixel through a scan line. The emission control driving circuit may provide an emission control signal to a pixel through an emission control line. The terminal located in the peripheral area PA may be exposed without being covered by an insulating layer, and may be electrically connected to the PCB 30. A terminal of the PCB 30 may be electrically connected to a terminal of the display panel 10.

The display area DA may include a component area CA, which is an area where a component including an optical element is located in a lower portion. A plurality of auxiliary pixels PM located in the component area CA may be located in the component area CA. The display apparatus may provide various auxiliary images by using light emitted by a plurality of auxiliary pixels PM arranged in the component area CA.

As will be described in more detail later, the component area CA may be an area where a component including an optical element or the like is located in a lower portion. The component area CA may include a transmission portion TA capable of transmitting light or/and sound that is output from a component to the outside or travels from the outside toward the component. When infrared light is transmitted by the component area CA, a light transmittance may be about 30% or greater, for example, about 50% or greater, about 75% or greater, about 80% or greater, about 85% or greater, or about 90% or greater.

As described above, the component area CA may include a transmissive area TA having a light transmittance of a preset value, and the transmissive area TA may include a partial area of the component area CA except for an area where the auxiliary pixels PM are located. The number of auxiliary pixels PM located in the component area CA may be less than the number of main pixels PX located in the main area AE1.

In order to increase the light transmittance of the component area CA, wires passing through or around the component area CA may include transparent electrodes using ITO or the like. In a cross-section, the layout of the component area CA may be the same as or similar to the layout of the display area DA or the main area AE1.

Figure 2:
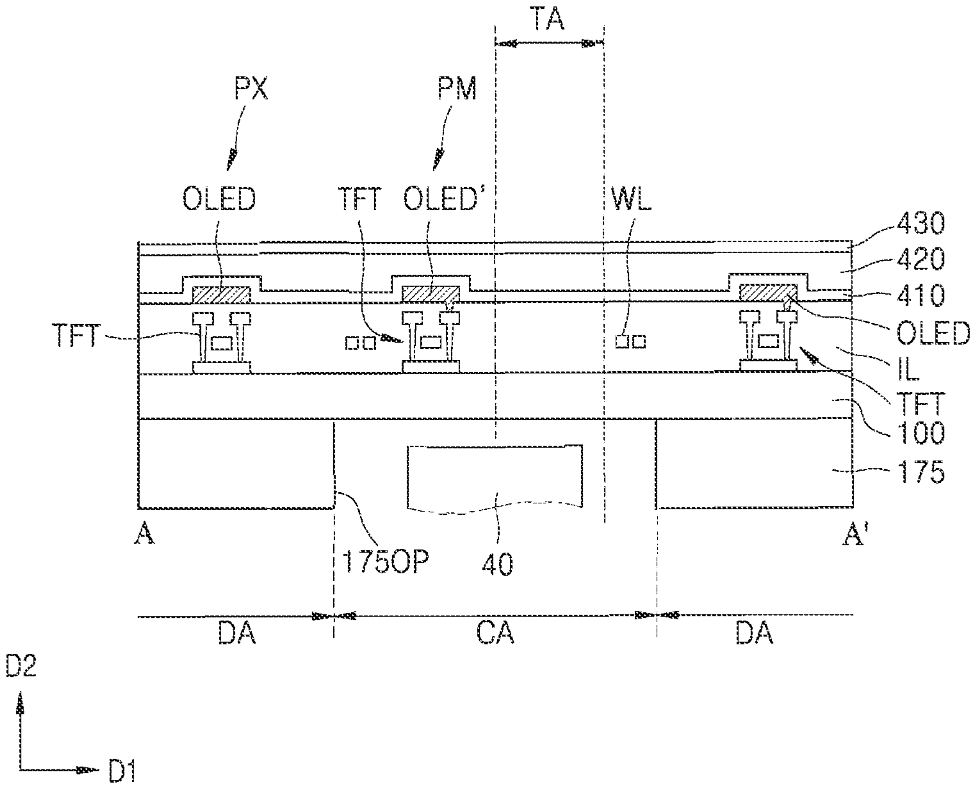
FIG. 2 is a cross-sectional view of the display apparatus of FIG. 1 taken along line A-A' of FIG. 1.

FIG. 2 is a cross-sectional view of the display apparatus of FIG. 1 taken along the line A-A' of FIG. 1.

Referring to FIG. 2, the display apparatus may include a display panel 10 and a component 40 located under the display panel 10 and located in correspondence with the component area CA.

The display panel 10 may further include a lower protective film 175 arranged below the substrate 100.

The substrate 100 may include glass or polymer resin. Examples of the polymer resin may include polyethersulfone, polyacrylate, polyetherimide, polyethylene naphthalate, polyethylene terephthalate, polyphenylene sulfide, polyarylate, polyimide, polycarbonate, and cellulose acetate propionate. The substrate 100 including polymer resin may have flexible, rollable, or bendable characteristics. The substrate 100 may have a multi-layered structure including a layer including the aforementioned polymer resin and an inorganic layer.

The display panel 10 may include a circuit layer including thin film transistors TFT and TFT', organic light-emitting diodes OLED and OLED' being display elements, and an insulating layer IL therebetween. A main pixel PX including a main thin film transistor TFT and a main organic light-emitting diode OLED connected thereto may be arranged in the main area AE1. And an auxiliary pixel PM including an auxiliary thin film transistor TFT' and an auxiliary organic light-emitting diode OLED' connected thereto may be arranged in the component area CA.

In the component area CA, the transmission portion TA having no auxiliary thin film transistors TFT' and no display elements arranged therein may be arranged. The transmission portion TA may be understood as a transmission area that transmits light/signal emitted by the component 20 or light/signal incident upon the component 20.

Display elements may be covered by thin film encapsulation layers 410, 420, and 430. The thin film encapsulation layers 410, 420, and 430 may include at least one inorganic encapsulation layer and at least one organic encapsulation layer. The thin film encapsulation layers 410, 420, and 430 may include first and second inorganic encapsulation layers 410 and 430 and an organic encapsulation layer 420 therebetween. The display elements may also be covered by an encapsulation substrate including a glass material containing $SiO_2$ as a main component.

The first and second inorganic encapsulation layers 410 and 430 may include at least one inorganic insulating material, such as aluminum oxide, titanium oxide, tantalum oxide, hafnium oxide, zinc oxide, silicon oxide, silicon nitride, silicon oxynitride, and/or the like. The organic encapsulation layer 420 may include a polymer-based material. Examples of the polymer-based material may include an acrylic resin, an epoxy-based resin, polyimide, and polyethylene.

The lower protective film 175 may be attached to a lower surface of the substrate 100 and may support and protect the substrate 100. The lower protective film 175 may include an opening 175OP corresponding to the component area CA. The lower protective film 175 may relatively improve the light transmittance of the transmission portion TA by including the opening 175OP. The lower protective film 175 may include polyethylene terephthalate or polyimide.

A plurality of components 20 may be arranged in the component area CA. The plurality of components 20 may perform different functions.

Figure 3:
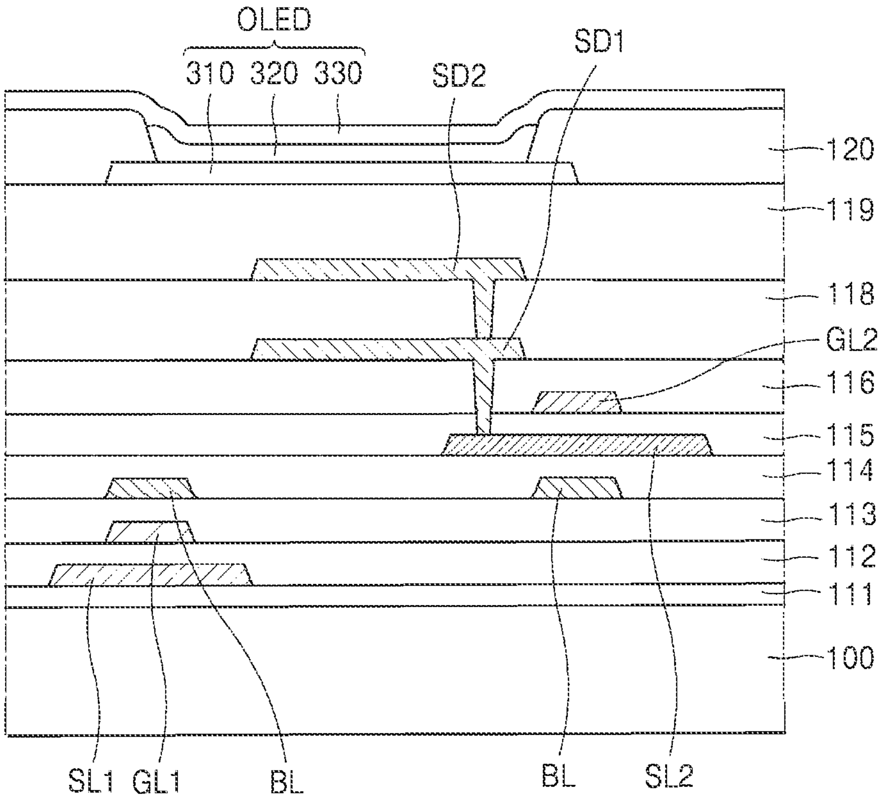
FIG. 3 is a cross-sectional view of an example of a pixel included in the display apparatus of FIG. 1.

FIG. 3 is a cross-sectional view of an example of a pixel included in the display apparatus of FIG. 1.

As shown in FIG. 3, the display apparatus according to some embodiments may include a substrate, a buffer layer 111, a first semiconductor layer SL1, a first interlayer insulating layer 112, a first gate layer GL1, a second interlayer insulating layer 113, a second gate layer BL, a third interlayer insulating layer 114, a second semiconductor layer SL2, a fourth interlayer insulating layer 115, a third gate layer GL2, a fifth interlayer insulating layer 116, a first conductive layer SD1, a first organic insulating layer 118, a second organic insulating layer 119, and a second conductive layer SD2.

As described above, the substrate 100 may include the display area DA and areas corresponding to the peripheral area PA outside the display area DA. The substrate 100 may include various materials having flexible or bendable characteristics. For example, the substrate 100 may include glass, metal, or polymer resin. The substrate 100 may include polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multi-layered structure including two layers each including a polymer resin and a barrier layer including an inorganic material (silicon oxide, silicon nitride, silicon oxynitride, or the like) and located between the two layers. In this way, various modifications may be made.

The buffer layer 111 may be located on the substrate 100. A buffer layer 111 may serve as a barrier layer and/or a blocking layer for preventing diffusion of impurity ions and penetration of moisture or external air and planarizing an upper surface of the substrate 100. The buffer layer 111 may include silicon oxide, silicon nitride, or silicon oxynitride. The buffer layer 111 may control a heat supply rate during a crystallization process for forming a first semiconductor layer SL1, such that the first semiconductor layer SL1 may be uniformly crystallized.

The first semiconductor layer SL1 may be located on the buffer layer 111. For convenience of explanation, the first semiconductor layer SL1 may be described as being located on the substrate 100.

The first semiconductor layer SL1 may be formed of polysilicon and may include a channel region undoped with impurities and a source region and a drain region which are doped with impurities and are respectively formed both sides of the channel region. The impurities may vary depending on the type of thin film transistor, and may be N-type impurities or P-type impurities.

The first interlayer insulating layer 112 may be located on the first semiconductor layer SL1. The first interlayer insulating layer 112 may be configured to secure insulation between the first semiconductor layer SL1 and the first gate layer GL1. The first interlayer insulating layer 112 may include an inorganic material such as silicon oxide, silicon nitride, and/or silicon oxynitride, and may be interposed between the first semiconductor layer SL1 and the first gate layer GL1. The first interlayer insulating layer 112 may have a shape corresponding to the entire surface of the substrate 100 and may have a structure in which contact holes are formed at preset portions. As such, an insulating layer including an inorganic material may be formed via chemical vapor deposition (CVD) or atomic layer deposition (ALD). This is equally applied to embodiments to be described later and modifications thereof.

The first gate layer GL1 may be located on the first interlayer insulating layer 112. For convenience of explanation, the first gate layer GL1 may be described as being located on the first semiconductor layer SL1.

The first gate layer GL1 may be located at a position vertically overlapping the first semiconductor layer SL1, and may include at least one metal of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

The second interlayer insulating layer 113 may be located on the first gate layer GL1. The second interlayer insulating layer 113 may cover the first gate layer GL1. The second interlayer insulating layer 113 may be formed of an inorganic material. For example, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. In some embodiments, the second interlayer insulating layer 113 may have a dual structure of $SiO_x/SiN_y$ or $SiN_x/SiO_y$.

The second gate layer BL may be located on the second interlayer insulating layer 113. For convenience of explanation, the second gate layer BL may be described as being located on the first gate layer GL1.

The second gate layer BL may include the same material as that included in the first gate layer GL1. For example, the second gate line BL may include at least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). For example, the second gate layer BL may include a plurality of layers including a Mo layer, a Ti layer, an Al layer, or a Cu layer.

The third interlayer insulating layer 114 may be located on the second gate layer BL. The third interlayer insulating layer 114 may cover the second gate layer BL. The third interlayer insulating layer 114 may be formed of an inorganic material. For example, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. In some embodiments, the third interlayer insulating layer 114 may have a dual structure of $SiO_x/SiN_y$ or $SiN_x/SiO_y$.

The second semiconductor layer SL2 may be located on the third interlayer insulating layer 114. For convenience of explanation, the second semiconductor layer SL2 may be described as being located on the second gate layer BL.

The second semiconductor layer SL2 may include an oxide semiconductor.

In detail, a first transistor directly affecting the brightness of the display apparatus includes a semiconductor layer including polycrystal silicon having a high reliability, and thus a high-resolution display apparatus may be realized.

Because an oxide semiconductor has high carrier mobility and a low leakage current, a voltage drop is not big even when a driving time is relatively long. In other words, because a change in the color of an image according to a voltage drop is not big even during low frequency driving, low frequency driving may be possible. As such, an oxide semiconductor provides a relatively small leakage current.

The fourth interlayer insulating layer 115 may be located on the second semiconductor layer SL2. The fourth interlayer insulating layer 115 may cover the second semiconductor layer SL2. The fourth interlayer insulating layer 115 may be formed of an inorganic material. For example, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. In some embodiments, the fourth interlayer insulating layer 115 may have a dual structure of $SiO_x/SiN_y$ or $SiN_x/SiO_y$.

The third gate layer GL2 may be located on the fourth interlayer insulating layer 115. For convenience of explanation, the third gate layer GL2 may be described as being located on the second semiconductor layer SL2.

The third gate layer GL2 may be located at a position vertically overlapping the second semiconductor layer SL2, and may include at least one metal of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

The fifth interlayer insulating layer 116 may be located on the third gate layer GL2. The fifth interlayer insulating layer 116 may cover the third gate layer GL2. The fifth interlayer insulating layer 116 may be formed of an inorganic material. For example, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. In some embodiments, the fifth interlayer insulating layer 116 may have a dual structure of $SiO_x/SiN_y$ or $SiN_x/SiO_y$.

The first conductive layer SD1 may be located on the fifth interlayer insulating layer 116. The first conductive layer SD1 may serve as an electrode that is connected to source/drain regions of the second semiconductor layer SL2 through a through hole included in the fifth interlayer insulating layer 116. The first conductive layer SD1 may also be connected to source/drain regions of the first semiconductor layer SL1 through a through hole included in the fourth interlayer insulating layer 115 and the fifth interlayer insulating layer 116. The first conductive layer SD1 may include at least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). For example, the first conductive layer SD1 may include a Ti layer, an Al layer, and/or a Cu layer.

The first organic insulating layer 118 may be located on the first conductive layer SD1. The first organic insulating layer 118 may be an organic insulating layer that covers an upper portion of the first conductive layer SD1 and has a substantially flat upper surface to serve as a planarization layer. The first organic insulating layer 118 may include an organic material, such as, acryl, benzocyclobutene (BCB) or hexamethyldisiloxane (HMDSO). Various modifications may be made to the first organic insulating layer 118. For example, the first organic insulating layer 118 may be a single layer or multiple layers.

The second conductive layer SD2 may be located on the first organic insulating layer 118. The second conductive layer SD2 may serve as an electrode that is connected to source/drain regions of a semiconductor layer through a through hole included in the first organic insulating layer 118. The second conductive layer SD2 may include at least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). For example, the second conductive layer SD2 may include a Ti layer, an Al layer, and/or a Cu layer.

The second organic insulating layer 119 may be located on the first conductive layer SD1. The second organic insulating layer 119 may be an organic insulating layer that covers an upper portion of the first conductive layer SD1 and has a substantially flat upper surface to serve as a planarization layer. The second organic insulating layer 119 may include an organic material, such as, acryl, benzocyclobutene (BCB) or hexamethyldisiloxane (HMDSO). Various modifications may be made to the second organic insulating layer 119. For example, the second organic insulating layer 119 may be a single layer or multiple layers.

According to some embodiments, an additional conductive layer and an additional insulating layer may be interposed between a conductive layer and a pixel electrode, and may be applied to various embodiments. In this case, the additional conductive layer may include the same material as that included in the above-described conductive layer, and have same layer structure as the above-described conductive layer. The additional insulating layer may include the same material as that included in the above-described organic insulating layer, and have same layer structure as the above-described organic insulating layer.

A pixel electrode 310 may be located on the second organic insulating layer 119. The pixel electrode 310 may be connected to the second conductive layer SD2 through contact holes TH1, TH2, and TH3 formed in the organic insulating layer 119. A display element may be located on the pixel electrode 310. An organic light-emitting diode OLED may be used as the display element. In other words, the organic light-emitting diode OLED may be located on, for example, the pixel electrode 310. The pixel electrode 310 may include a light-transmissive conductive layer formed of a light-transmissive conductive oxide such as ITO, $In_2O_3$, or IZO, and a reflective layer formed of a metal such as Al or Ag. For example, the pixel electrode 310 may have a three-layered structure of ITO/Ag/ITO.

A pixel defining layer 120 may be located on the organic insulating layer 119, and may be arranged to cover an edge of the pixel electrode 310. In other words, the pixel defining layer 120 may cover an edge of each of a plurality of pixel electrodes. The pixel defining layer 120 may have an opening corresponding to the pixel PX, and the opening may be formed to expose at least a central portion of the pixel electrode 310. The pixel defining layer 120 may include an organic material, for example, polyimide or HMDSO. For example, the pixel defining layer 120 may cover an edge of each of the pixel electrode 310.

A spacer may be located on the pixel defining layer 120. The spacer is shown to be positioned on the peripheral area PA, but may also be positioned on the display area DA. The spacer may prevent the organic light-emitting diode OLED from being damaged due to sagging of a mask in a manufacturing process of using the mask. The spacer may include an organic insulative material and may be a single layer or multiple layers.

The intermediate layer 320 and an opposite electrode 330 may be located on the opening of the pixel defining layer 120. The opposite electrode 330 may be located on a metal oxide layer 107. The intermediate layer 320 may include a low molecular weight or high molecular weight material, and, when the intermediate layer 320 includes a low-molecular weight material, the intermediate layer 320 may include a hole injection layer, a hole transport layer, an emission layer, an electron transport layer, and/or an electron injection layer. When the intermediate layer 320 includes a high-molecular weight material, the intermediate layer 320 may generally have a structure including an HTL and an emission layer.

The intermediate layer 320 is not limited to the above-described structure, and may have any of various other structures. For example, at least one of the layers that constitute the intermediate layer 320 may be integrally formed with the opposite electrode 330.

The opposite electrode 330 may include a light-transmissive conductive layer formed of a light-transmissive conductive oxide such as ITO, $In_2O_3$, or IZO. The pixel electrode 310 is used as an anode electrode, and the opposite electrode 330 is used as a cathode electrode. Alternatively, the pixel electrode 310 may be used as a cathode electrode, and the opposite electrode 330 may be used as an anode electrode.

The opposite electrode 330 may be arranged on the display area DA and may cover the entire display area DA. In other words, the opposite electrode 330 may be integrally formed to cover a plurality of pixels. The opposite electrode 330 may electrically contact a common power supply line arranged on the peripheral area PA. According to some embodiments, the opposite electrode 330 may extend up to a barrier wall.

Figure 4:
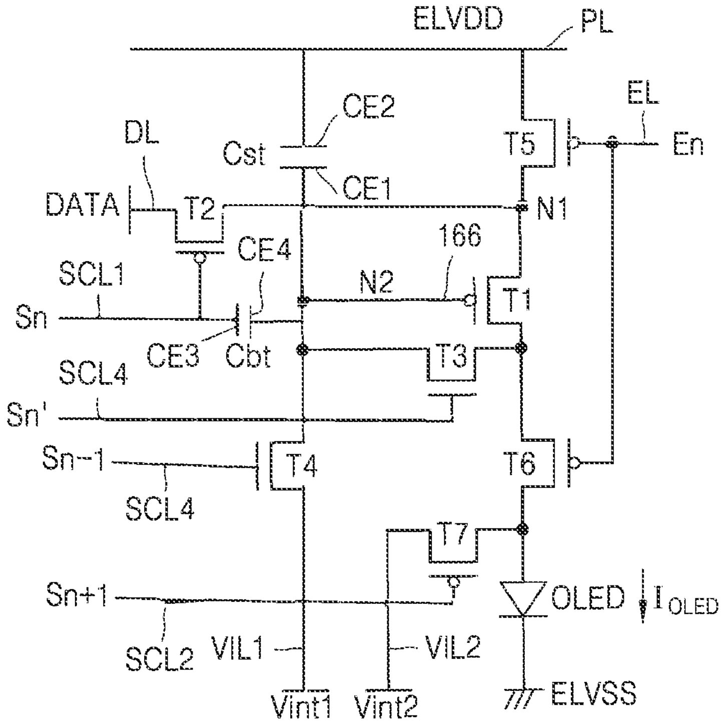
FIG. 4 is an equivalent circuit diagram of an example of a pixel included in the display apparatus of FIG. 1.

FIG. 4 is an equivalent circuit diagram of an example of a pixel included in the display apparatus of FIG. 1.

As shown in FIG. 4, the pixel PX includes a plurality of transistors, namely, first, second, third, fourth, fifth, sixth, and seventh transistors T1, T2, T3, T4, T5, T6, and T7, a first capacitor Cst, a second capacitor Cbt, an organic light-emitting diode OLED as a display element, and signal lines, first and second initialization voltage lines VIL1 and VIL2, and a power supply voltage line PL connected thereto. The signal lines may include a data line DL, a first scan line SCL1, a second scan line SCL2, a third scan line SCL3, a fourth scan line SCL4, and a light-emission control line EL. According to some embodiments, the first and second initializing voltage lines VIL1 and VIL2, the power supply voltage line PL, and/or at least one of the signal lines may be shared by neighboring pixels.

The power supply voltage line PL may transmit a first power supply voltage ELVDD to the first transistor T1. The first initializing voltage line VIL1 may transmit, to the pixel PX, a first initializing voltage Vint1 that initializes the first transistor T1. The second initializing voltage line VIL2 may transmit, to the pixel PX, a second initializing voltage Vint2 that initializes the organic light-emitting diode OLED.

The first scan line SCL1, the second scan line SCL2, the third scan line SCL3, the fourth scan line SCL4, the light-emission control line EL, and the first and second initializing voltage lines VIL1 and VIL2 may each extend in a first direction D1 and may be arranged on respective rows to be apart from each other. The data line DL and the power supply voltage line PL may each extend in a second direction D2 and may be arranged on respective columns to be apart from each other.

In FIG. 4, the third transistor T3 and the fourth transistor T4 among the first, second, third, fourth, fifth, sixth, and seventh transistors T1, T2, T3, T4, T5, T6, and T7 are implemented using n-channel MOSFETs (NMOSs), and the others are implemented using p-channel MOSFETs (PMOSs). However, this is only one example. and does not limit the disclosure.

The first transistor T1 is connected to the power supply voltage line PL through the fifth transistor T5, and is electrically connected to the organic light-emitting diode OLED through the sixth transistor T6. The first transistor T1 severs as a driving transistor, and receives a data signal DATA according to a switching operation of the second transistor T2 and supplies a driving current $I_{OLED}$ to the organic light-emitting diode OLED.

The second transistor T2 is connected to the first scan line SCL1 and the data line DL, and is connected to the power supply voltage line PL via the fifth transistor T5. The second transistor T2 is turned on in response to a first scan signal Sn received through the first scan line SCL1, to perform a switching operation of transmitting the data signal DATA received through the data line DL to a node N1.

The third transistor T3 is connected to the fourth scan line SCL4 and is connected to the organic light-emitting diode OLED via the sixth transistor T6. The third transistor T3 is turned on according to a fourth scan signal Sn' received via the fourth scan line SCL4 and thus diode-connects the first transistor T1.

The fourth transistor T4 is connected to the third scan line SCL3, which is a previous scan line, and the first initializing voltage line VIL1, and is turned on according to a third scan signal Sn-1, which is a previous scan signal, received via the third scan line SCL3 and thus transmits the first initializing voltage Vint1 from the first initializing voltage line VIL1 to a gate electrode of the first transistor T1 to thereby initialize the voltage of the gate electrode of the first transistor T1.

The fifth transistor T5 and the sixth transistor T6 are connected to the light-emission control line EL, and are simultaneously turned on according to a light-emission control signal EN received through the light-emission control line EL and thus form a current path so that the driving current $I_{OLED}$ flows from the power supply voltage line PL to the organic light-emitting diode OLED.

The seventh transistor T7 is connected to the second scan line SCL2, which is a next scan line, and the second initializing voltage line VIL2, and is turned on in response to a second scan signal Sn+1, which is a next scan signal, received through the second scan line SCL2 to transmit the second initializing voltage Vint2 from the second initializing voltage line VIL2 to the organic light-emitting diode OLED, thereby initializing the organic light-emitting diode OLED. The seventh transistor T7 may be omitted.

The first capacitor Cst includes a first electrode CE1 and a second electrode CE2. The first electrode CE1 is connected to the gate electrode of the first transistor T1, and the second electrode CE2 is connected to the power supply voltage line PL. The first capacitor Cst may maintain a voltage applied to the gate electrode of the first transistor T1, by storing and maintaining a voltage corresponding to a difference between the voltage of the power supply voltage line PL and the voltage of the gate electrode of the first transistor T1.

The second capacitor Cbt includes a third electrode CE3 and a fourth electrode CE4. The third electrode CE3 is connected to the first scan line SCL1 and the gate electrode of the second transistor T2. The fourth electrode CE4 is connected to the gate electrode of the first transistor T1 and the first electrode CE1 of the first capacitor Cst. The second capacitor Cbt is a boosting capacitor, and, when the first scan signal Sn of the first scan line SCL1 is a voltage that turns off the second transistor T2, the second capacitor Cbt may increase the voltage of a node N2 to reduce a voltage (black voltage) that expresses a black color.

The organic light-emitting diode OLED may include a pixel electrode and an opposite electrode, and the opposite electrode may receive a second power supply voltage ELVSS. The organic light-emitting diode OLED may receive the driving current $I_{OLED}$ from the first transistor T1 and emit light, thereby displaying an image.

A detailed operation of each pixel PX according to some embodiments will now be described in more detail.

During a first initialization period, when the previous third scan signal Sn−1 is supplied via the third scan line SCL3, the fourth transistor T4 is turned on in response to the previous first scan signal Sn−1, and the first transistor T1 is initialized by the first initializing voltage Vint1 supplied from the first initializing voltage line VIL1.

During a data programming period, when the first scan signal Sn and the fourth scan signal Sn' are supplied through the first scan line SCL1 and the fourth scan line SCL2, the second transistor T2 and the third transistor T3 are turned on in response to the first scan signal Sn and the fourth scan signal Sn'. At this time, the first transistor T1 is diode-connected by the turned-on third transistor T3 and is biased in a forward direction. Then, a voltage in which a threshold voltage Vth of the first transistor T1 has been compensated for in the data signal DATA supplied from the data line DL is applied to the gate electrode of the first transistor T1. The first power supply voltage ELVDD and a compensating voltage are applied to both ends of the first capacitor Cst, and a charge corresponding to a voltage difference between both ends is stored in the first capacitor Cst.

During a light emission period, the fifth transistor T5 and the sixth transistor T6 are turned on by the emission control signal EN supplied from the emission control line EL. The driving current $I_{OLED}$ is generated according to a voltage difference between the voltage of the gate electrode of the first transistor T1 and the first power supply voltage ELVDD, and is supplied to the organic light-emitting diode OLED through the sixth transistor T6.

During a second initialization period, when the second scan signal Sn+1 is supplied via the second scan line SCL2, the seventh transistor T7 is turned on in response to the second scan signal Sn+1, and the organic light-emitting diode OLED is initialized by the second initializing voltage Vint2 supplied from the second initializing voltage line VIL2.

According to some embodiments, at least one of the first, second, third, fourth, fifth, sixth, and seventh transistors T1, T2, T3, T4, T5, T6, and T7 includes a semiconductor layer including oxide, and the others include a semiconductor layer including silicon. In detail, a first transistor directly affecting the brightness of the display apparatus includes a semiconductor layer including polycrystal silicon having a high reliability, and thus a high-resolution display apparatus may be realized.

Because an oxide semiconductor has high carrier mobility and a low leakage current, a voltage drop is not big even when a driving time is long. In other words, because a change in the color of an image according to a voltage drop is not big even during low frequency driving, low frequency driving is possible. Because an oxide semiconductor has a small leakage current as described above, at least one of the third transistor T3 and the fourth transistor T4 connected to the gate electrode of the first transistor T1 includes an oxide semiconductor in order to prevent flowing of a leakage current to the gate electrode of the first transistor T1 and also reduce power consumption. In some cases, an oxide semiconductor may be applied to all transistors.

Figure 5:
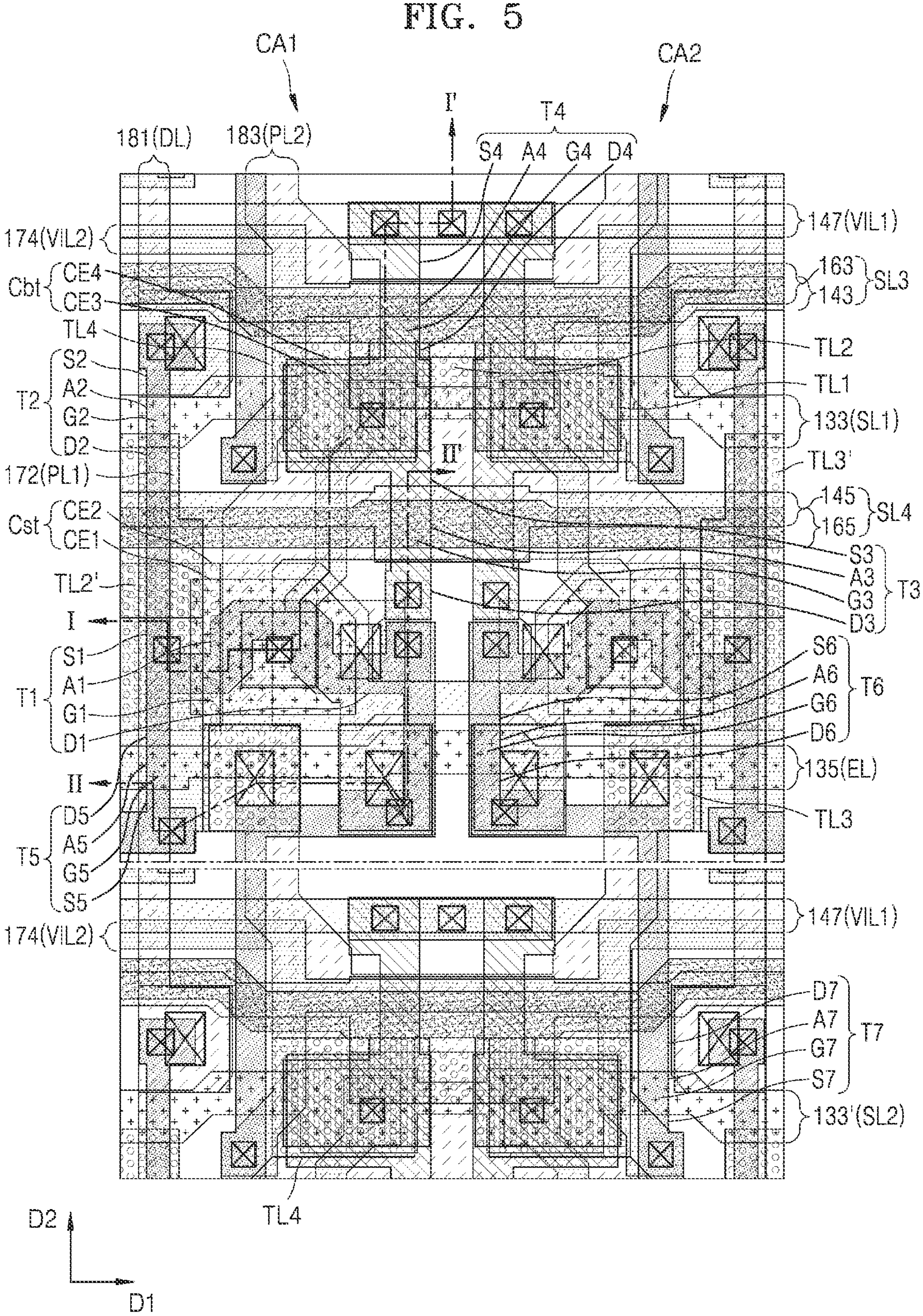
FIG. 5 is a schematic layout diagram illustrating locations of a plurality of thin film transistors and capacitors arranged in a pair of pixels included in the display apparatus of FIG. 1.

FIG. 5 is a schematic layout diagram illustrating locations of a plurality of thin film transistors and capacitors arranged in a pair of pixels included in the display apparatus of FIG. 1. For reference, for convenience of description, a description of a transparent electrode layer will be given later with reference to FIG. 6.

FIG. 5 illustrates a pair of pixels PX arranged on the same row of adjacent columns. In FIG. 5, a pixel circuit of a pixel arranged in a left pixel region CA1 and a pixel circuit of a pixel arranged in a right pixel region CA2 are bilaterally symmetrical to each other.

As shown in FIG. 5, a pixel circuit of a display apparatus according to some embodiments includes a first scan line 133, a second scan line 133', a third scan line SCL3, a fourth scan line SCL4, an emission control line 135, and an initialization voltage line each extending in a first direction D1, and includes a node connection line 171 and first and second power supply voltage lines 172 and 183 each extending in a second direction D2 intersecting the first direction D1. The initialization voltage line may include a first initialization voltage line 147 and a second initialization voltage line 174.

The pixel circuit may also include a first transistor T1, a second transistor T2, a third transistor T3, a fourth transistor T4, a fifth transistor T5, a sixth transistor T6, a seventh transistor T7, a first capacitor Cst, and a second capacitor Cbt.

According to some embodiments, the first transistor T1, the second transistor T2, the fifth transistor T5, the sixth transistor T6, and the seventh transistor T7 may be thin-film transistors each including a silicon semiconductor. The third transistor T3 and the fourth transistor T4 may be thin-film transistors each including an oxide semiconductor.

The second scan line 133' may be a first scan line SCL1 in a next row. In other words, the first scan line 133 shown in FIG. 3 may be a second scan line SCL2 in a previous row. FIG. 3 illustrates both a seventh transistor T7 connected to a pixel in a previous row and located in a pixel region in a current row and a seventh transistor T7 connected to a pixel in a current row and located in a pixel region in a next row. For convenience of illustration and description, the seventh transistor T7 located in the pixel region of the current row will now be illustrated and described.

Respective semiconductor layers of the first transistor T1, the second transistor T2, the fifth transistor T5, the sixth transistor T6, and the seventh transistor T7 are arranged on same layers and include the same materials. For example, the semiconductor layers may be formed of polycrystalline silicon. The respective semiconductor layers of the first transistor T1, the second transistor T2, the fifth transistor T5, the sixth transistor T6, and the seventh transistor T7 may be connected to one another and may be bent in various shapes.

Each of the respective semiconductor layers of the first transistor T1, the second transistor T2, the fifth transistor T5, the sixth transistor T6, and the seventh transistor T7 may include a channel region, and a source region and a drain region on both sides of the channel region. For example, the source region and the drain region may be doped with impurities that may include N-type impurities or P-type impurities. The source region and the drain region may correspond to a source electrode and a drain electrode, respectively. The source region and the drain region may be interchanged to each other according to the property of a transistor. Hereinafter, a source region and a drain region are used instead of a source electrode and a drain electrode.

The first transistor T1 includes a first sub-semiconductor layer AS1 and a first gate electrode G1. The first sub-semiconductor layer AS1 may be a portion of the first semiconductor layer SL1. The first sub-semiconductor layer AS1 includes a first channel region A1, and a first source region S1 and a first drain region D1 respectively on both sides of the first channel region A1. The first sub-semiconductor layer AS1 may have a curved shape, and thus the first channel region A1 may be longer than other channel regions A2 through A7. For example, the first sub-semiconductor layer AS1 may have a long channel within a narrow space by having a shape obtained via a plurality of bending actions, such as '§ ¤', '©¤', 'S', 'M', or 'W'. When the first channel region A1 is long, a driving range of a gate voltage applied to the first gate electrode G1 is widened. As a result, a gray scale of light emitted from the organic light-emitting diode OLED may be more elaborately controlled and display quality may be relatively improved. According to some embodiments, the first sub-semiconductor layer AS1 may be provided in a straight shape rather than a curved shape. The first gate electrode G1 is of an island type, and is provided to overlap the first channel region A1 with the first gate insulating layer 112 interposed therebetween.

The first capacitor Cst may be arranged to overlap the first transistor T1. The first capacitor Cst includes a first electrode CE1 and a second electrode CE2. The first gate electrode G1 may not only function as a control electrode of the first transistor T1 but also function as the first electrode CE1 of the first capacitor Cst. In other words, the first gate electrode G1 and the first electrode CE1 may be integrally formed with each other. The second electrode CE2 of the first capacitor Cst is provided to overlap the first electrode CE1 with the second gate insulating layer 113 (see FIG. 4) interposed therebetween. In this case, the second interlayer insulating layer 113 may function as a dielectric layer of the first capacitor Cst.

The node connection line 171 may be electrically connected to the first electrode CE1 and a third sub-semiconductor layer AO3 of the third transistor T3. The second electrode CE2 may be electrically connected to the first power supply voltage line 172, and the first power supply voltage line 172 may be electrically connected to the second power voltage supply line 183. The first power supply voltage line 172 and the second power supply voltage line 183 may each extend in the second direction D2. The second electrode CE2 may extend in the first direction D1, and thus may transmit the first power supply voltage ELVDD in the first direction D1. Accordingly, in the display area DA, a plurality of first and second power supply voltage lines 172 and 183 and a plurality of second electrodes CE2 may form a mesh structure.

The second transistor T2 includes a second sub-semiconductor layer AS2 and a second gate electrode G2. The second sub-semiconductor layer AS2 may be a portion of the first semiconductor layer SL1. The second sub-semiconductor layer AS2 includes a second channel region A2, and a second source region S2 and a second drain region D2 respectively on both sides of the second channel region A2. The second source region S2 is electrically connected to the data line 181, and the second drain region D2 is connected to the first source region S1. The second gate electrode G2 is provided as a portion of the first scan line 133.

The fifth transistor T5 includes a fifth sub-semiconductor layer and a fifth gate electrode G5. The fifth sub-semiconductor layer AS5 may be a portion of the first semiconductor layer SL1. The fifth sub-semiconductor layer AS5 includes a fifth channel region A5, and a fifth source region S5 and a fifth drain region D5 respectively on both sides of the fifth channel region A5. The fifth source region S5 may be electrically connected to the first power supply voltage line 172, and the fifth drain region D5 may be connected to the first source region S1. The fifth gate electrode G5 is provided as a portion of the emission control line 135.

The sixth transistor T6 includes a sixth sub-semiconductor layer AS6 and a sixth gate electrode G6. The sixth sub-semiconductor layer AS6 may be a portion of the first semiconductor layer SL1. The sixth sub-semiconductor layer AS6 includes a sixth channel region A6, and a sixth source region S6 and a sixth drain region D6 respectively on both sides of the sixth channel region A6. The sixth source region S6 may be connected to the first drain region D1, and the sixth drain region D6 may be electrically connected to the pixel electrode 310 of the organic light-emitting diode OLED. The sixth gate electrode G6 is provided as a portion of the emission control line 135.

The seventh transistor T7 includes a seventh sub-semiconductor layer AS7 and a seventh gate electrode G7. The seventh sub-semiconductor layer AS7 includes a seventh channel region A7, and a seventh source region S7 and a seventh drain region D7 respectively on both sides of the seventh channel region A7. The seventh source region S7 may be electrically connected to the second initialization voltage line 174, and the seventh drain region D7 may be connected to the sixth drain region D6. The seventh gate electrode G7 is provided as a portion of the second scan line 133'.

The first interlayer insulating layer 114 (see FIG. 4) may be located on the first, second, fifth, sixth, and seventh transistors T1, T2, T5, T6, and T7 each including a silicon semiconductor, and the third and fourth transistors T3 and T4 each including an oxide semiconductor may be located on the third interlayer insulating layer 114.

The semiconductor layers of the third transistor T3 and the fourth transistor T4 are arranged on same layers and include the same materials. For example, the semiconductor layers may be formed of an oxide semiconductor.

The semiconductor layers may include a channel region, and a source region and a drain region on both sides of the channel region. For example, the source region and the drain region may be regions in which carrier concentration is increased by plasma treatment. The source region and the drain region may correspond to a source electrode and a drain electrode, respectively. Hereinafter, a source region and a drain region are used instead of a source electrode and a drain electrode.

The third transistor T3 includes a third sub-semiconductor layer AO3 including an oxide semiconductor, and the third gate electrode G3. The third sub-semiconductor layer AO3 may be a portion of the second semiconductor layer SL2. The third sub-semiconductor layer AO3 includes a third channel region A3, and a third source region S3 and a third drain region D3 respectively on both sides of the third channel region A3. The third source region S3 may be bridge-connected to the first gate electrode G1 through the node connection line 171. The third source region S3 may be connected to a fourth source region D4 arranged on a same layer on which the third source region S3 is arranged. The third drain area D3 may be electrically connected to the first sub-semiconductor layer AS1 of the first transistor T1 and the sixth semiconductor layer of the sixth transistor T6. The third gate electrode G3 is provided as a portion of the fourth scan line SCL4.

The fourth transistor T4 includes a fourth sub-semiconductor layer AO4 including an oxide semiconductor, and a fourth gate electrode G4. The fourth sub-semiconductor layer AO4 may be a portion of the second semiconductor layer SL2. The fourth sub-semiconductor layer AO4 includes a fourth channel region A4, and a fourth source region S4 and a fourth drain region D4 respectively on both sides of the fourth channel region A4. The fourth source region S4 may be electrically connected to the first initialization voltage line 147, and the fourth drain region D4 may be bridge-connected to the first gate electrode G1 through the node connection line 171. The fourth gate electrode G4 is provided as a portion of the third scan line SCL3.

A fourth interlayer insulating layer 115 is located between the third sub-semiconductor layer AO3 and the third gate electrode G3 and between the fourth sub-semiconductor layer AO4 and the fourth gate electrode G4 to correspond to the third and fourth channel regions A3 and A4 of the third and fourth sub-semiconductor layers AO3 and AO4.

The third electrode CE3 of the second capacitor Cbt is provided as a portion of the first scan line 133 and is connected to the second gate electrode G2. The fourth electrode CE4 of the second capacitor Cbt may be arranged to overlap the third electrode CE3, and may be formed of an oxide semiconductor. The fourth electrode CE4 may be provided on a same layer as the third sub-semiconductor layer AO3 of the third transistor T3 and the fourth sub-semiconductor layer AO4 of the fourth transistor T4, and may be a region between the third and fourth sub-semiconductor layers AO3, AO4. Alternatively, the fourth electrode CE4 may be provided by extending from the fourth sub-semiconductor layer AO4. Alternatively, the third sub-semiconductor layer AO3 may be provided by extending from the third semiconductor layer.

A fifth interlayer insulating layer 116 may be located on the third and fourth transistors T3 and T4 including oxide semiconductors, and the first power supply voltage line 172 and the node connection line 171 may be located over the fifth interlayer insulating layer 116.

The first organic insulating layer 118 may be located over the first power supply voltage line 172, and the data line 181 and the second power supply voltage line 183 may extend in the second direction D2 over the first organic insulating layer 118.

According to some embodiments, the first scan line 133, the second scan line 133', and the emission control line 135 may be provided on a same layer as the first gate electrode G1 and formed of the same material as the first gate electrode G1.

According to some embodiments, some of the lines may be provided as two conductive layers arranged on different layers. For example, the third scan line SCL3 may include a lower scan line 143 and an upper scan line 163 located on different layers. The lower scan line 143 may be formed of the same material as the second electrode CE2 of the first capacitor Cst on a same layer as the second electrode CE2 of the first capacitor Cst. The upper scan line 163 may be located over the fourth interlayer insulating layer 115. The lower scan line 143 may be arranged to at least partially overlap the upper scan line 163. Because the lower scan line 143 and the upper scan line 163 correspond to portions of the third gate electrode G3 of the third transistor T3, the third transistor T3 may have a dual gate structure including control electrodes above and below a semiconductor layer, respectively.

The fourth scan line SCL4 may include a lower scan line 145 and an upper scan line 165 located on different layers. The lower scan line 145 may be formed of the same material as the second electrode CE2 of the first capacitor Cst on a same layer as the second electrode CE2 of the first capacitor Cst. The upper scan line 165 may be located over the fourth interlayer insulating layer 115. The lower scan line 145 may be arranged to at least partially overlap the upper scan line 165. Because the lower scan line 145 and the upper scan line 165 correspond to portions of the fourth gate electrode G4 of the fourth transistor T4, the fourth transistor T4 may have a dual gate structure including control electrodes above and below a semiconductor layer, respectively.

The initialization voltage line VIL may include a first initialization voltage line 147 and a second initialization voltage line 174 located on different layers. The first initialization voltage line 147 may be formed of the same material as the second electrode CE2 of the first capacitor Cst on a same layer as the second electrode CE2 of the first capacitor Cst. The second initialization voltage line 174 may be formed of the same material as that used to form the first power supply voltage line 172, on a same layer on which the first power supply voltage line 172 is formed.

For reference, some of the reference numerals shown in FIG. 5 will now be described with reference to FIGS. 6 through 15.

Figure 6:
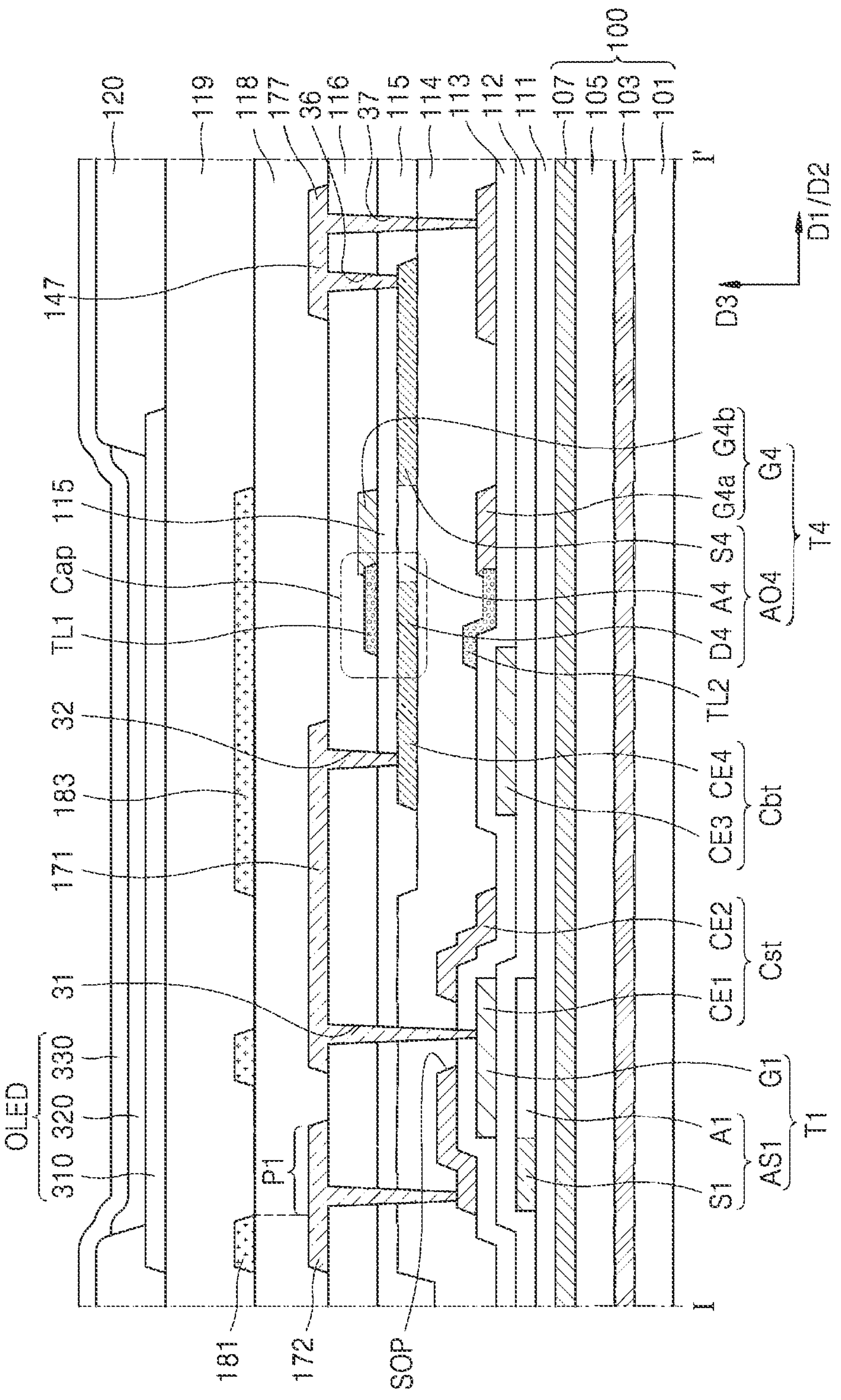
FIG. 6 is a schematic cross-sectional view taken along line I-I' of FIG. 5.

FIG. 6 is a schematic cross-sectional view taken along line I-I' of FIG. 5. In the description of FIG. 6, the same or overlapping matters as those described above may be omitted.

For reference, FIG. 6 shows cross-sections of portions corresponding to the first transistor T1, the fourth transistor T4, the first capacitor Cst, the second capacitor Cbt, and the organic light-emitting diode OLED, and some members may be omitted.

As shown in FIG. 6, the substrate 100 may have a structure of a single layer or multiple layers. The multi-layered structure may further include an inorganic layer. For example, the substrate 100 may include a first base layer 101, a first barrier layer 103, a second base layer 105, and a second barrier layer 107. Each of the first and second base layers 101 and 105 may include polymer resin. The first and second base layers 101 and 105 may include transparent polymer resin. Each of the first and second barrier layers 103 and 107 is a barrier layer that prevents infiltration of external foreign materials, and thus may be a single layer or multiple layers including an inorganic material, such as silicon nitride ($SiN_x$) or silicon oxide ($SiO_x$).

The first semiconductor layer SL1 may be located on the substrate 100, may include a silicon semiconductor, and may include a first source region S1, a first drain region, and a first channel region A1 located between the first source region S1 and the first drain region. The first drain region D1 is not shown in FIG. 6. However, referring to other drawings, the first channel region A1 is located between the first source region S1 and the first drain region D1.

The first gate layer GL1 may be located on the first semiconductor layer SL1. A first interlayer insulating layer 112 may be located between the first gate layer GL1 and the first semiconductor layer SL1, and the first gate layer GL1 may be insulated from the first semiconductor layer SL1 by the first interlayer insulating layer 112. The first gate layer GL1 may include the first gate electrode G1, and the first gate electrode G1 may be located on the first channel region A1 of the first semiconductor layer SL1. The first gate electrode G1, the first source region S1, the first drain region D1, and the first channel region A1 may form the above-described first transistor T1.

The second gate layer BL may be located on the first gate layer GL1 and may be spaced apart from the first gate layer GL1 in a third direction D3. A second interlayer insulating layer 113 may be located between the second gate layer BL and the first gate layer GL1, and the second gate layer BL may be spaced apart from or insulated from the first gate layer GL1 in the third direction D3 by the second interlayer insulating layer 113.

The second semiconductor layer SL2 may be located on the second gate layer BL and may be spaced apart from the second gate layer BL in the third direction D3. A third interlayer insulating layer 114 may be located between the second semiconductor layer SL2 and the second gate layer BL, and the second semiconductor layer SL2 may be spaced apart from or insulated from the second gate layer BL in the third direction D3 by the third interlayer insulating layer 114. The second semiconductor layer SL2 may include an oxide semiconductor, and may include the fourth source region S4, the fourth drain region D4, and the fourth channel region A4 located between the fourth source region S4 and the fourth drain region D4.

The third gate layer GL2 may be located on the second semiconductor layer SL2. A fourth interlayer insulating layer 115 may be located between the third gate layer GL2 and the second semiconductor layer SL2, and the third gate layer GL2 may be insulated from the second semiconductor layer SL2 by the fourth interlayer insulating layer 115. The third gate layer GL2 may include the fourth gate electrode G4, and the fourth gate electrode G4 may be located on the fourth channel region A4 of the second semiconductor layer SL2. The fourth gate electrode G4, the fourth source region S4, the fourth drain region D4, and the fourth channel region A4 may form the above-described fourth transistor T4.

The first transparent electrode layer TL1 may be arranged on a same layer as the layer on which the third gate layer GL2 is arranged. In a view in a direction perpendicular to the substrate 100, the first transparent electrode layer TL1 may overlap at least a portion of the second semiconductor layer SL2. In detail, the first transparent electrode layer TL1 and the second semiconductor layer SL2 may form one capacitance.

For example, the display apparatus according to some embodiments may include a capacitance Cap using the second semiconductor layer SL2 as a first electrode and the first transparent electrode layer TL1 as a second electrode.

For example, the display apparatus according to some embodiments may further include a first capacitor unit including a 1-1$^{st}$ electrode and a 1-2$^{nd}$ electrode insulated from the 1-1$^{st}$ electrode. The first capacitor unit may constitute the above-described capacitance Cap. In this case, the 1-1$^{st}$ electrode may be the first transparent electrode layer TL1 or a portion of the first transparent electrode layer TL1. The 1-2 electrode may be a portion of the second semiconductor layer SL2. In order to configure the capacitance Cap, the 1-1$^{st}$ electrode and the 1-2$^{nd}$ electrode may overlap each other when viewed in the direction perpendicular to the substrate 100.

In FIG. 6, the first transparent electrode layer TL1 overlaps the fourth drain region D4 in the direction perpendicular to the substrate 100, but this is just an example. The first transparent electrode layer TL1 may also overlap another region of the second semiconductor layer SL2 in the direction perpendicular to the substrate 100. The first transparent electrode layer TL1 may be connected to a wire of the third gate layer GL2 that extends in the first direction D1.

For convenience of description, the first transparent electrode layer TL1 may be variously referred to as a 1-2$^{nd}$ transparent electrode layer, a 2-1$^{st}$ transparent electrode layer, a 3-3$^{rd}$ transparent electrode layer, and the like. In this specification, the first transparent electrode layer TL1 may be defined as a transparent electrode layer arranged on a same layer as the layer on which the third gate layer GL2 is arranged.

The first transparent electrode layer TL1 may include a light-transmissive conductive material, such as ITO, $In_2O_3$, or IZO. In other words, the first transparent electrode layer TL1 may include a light-transmissive conductive material to perform a function of transparent wiring. However, other transparent electrode layers or sub-transparent electrode layers to be described later may include the same material as the first transparent electrode layer TL1.

The first transparent electrode layer TL1 may be located in a main area AE1 of the display apparatus, and may be formed simultaneously with a first sub-transparent electrode layer located in the component area CA of the display apparatus. In other words, the display apparatus may not only include the first transparent electrode layer TL1 located in the main area AE1, but may also further include the first sub-transparent electrode layer located in the component area CA, located on a same layer as the first transparent electrode layer TL1, and including the same material as the first transparent electrode layer TL1. Because the wiring of the component area CA is made of a transparent electrode material, the first transparent electrode layer TL1 may be formed simultaneously with transparent wiring such as the first sub-transparent electrode layer of the component area CA. As such, because the first transparent electrode layer TL1 and the transparent wiring such as the first sub-transparent electrode layer of the component region CA are simultaneously formed, the first transparent electrode layer TL1 may be easily formed without an additional process or mask.

As such, the display apparatus according to some embodiments may reduce the area of the fourth gate electrode by forming capacitance by using the first transparent electrode layer TL1 and the second semiconductor layer SL2. In other words, by reducing the area of the fourth gate electrode and forming the first transparent electrode layer TL1 corresponding to the reduced area, a display apparatus having the same capacitance but increased light transmittance may be provided. In addition, the area of another opaque electrode such as the second gate layer BL may be reduced by the magnitude of the capacitance additionally formed using the first transparent electrode layer TL1.

The first conductive layer SD1 may be arranged on the third gate layer GL2 and the first transparent electrode layer TL1. The first conductive layer SD1 may be spaced apart from the third gate layer GL2 and the first transparent electrode layer TL1 in the direction perpendicular to the substrate 100.

A fifth interlayer insulating layer 116 may be located between the first conductive layer SD1, the third gate layer GL2, and the first transparent electrode layer TL1, and the first conductive layer SD1 may be spaced apart from the third gate layer GL2 and the first transparent electrode layer TL1 by the fifth interlayer insulating layer 116.

The second conductive layer SD2 may be located on the first conductive layer SD1. The first organic insulating layer 118 may be arranged between the second conductive layer SD2 and the first conductive layer SD1. The second organic insulating layer 119 may be located on the second conductive layer SD2, and a pixel electrode may be located on the second organic insulating layer 119.

The second transparent electrode layer TL2 may be located on a same layer as the second gate layer BL and may include the same material as the first transparent electrode layer TL1. When viewed in the direction perpendicular to the substrate 100, the second transparent electrode layer TL2 may overlap at least a portion of the first transparent electrode layer TL1. The second transparent electrode layer TL2 may be connected to a wire of the second gate layer BL that extends in the first direction D1. In some cases, the entire wiring of the second gate layer BL that extends in the first direction D1 may include the same material as the first transparent electrode layer TL1.

For convenience of description, the second transparent electrode layer TL2 may be variously referred to as a 1-1$^{st}$ transparent electrode layer, a 2-3$^{rd}$ transparent electrode layer, a 3-1$^{st}$ transparent electrode layer, and the like. In this specification, the second transparent electrode layer TL2 may be defined as a transparent electrode layer arranged on a same layer as the layer on which the second gate layer BL is arranged.

As at least a portion of the second transparent electrode layer TL2 overlaps the first transparent electrode layer TL1, an area of the second gate layer BL may be reduced. A transmittance of the display apparatus according to some embodiments may increase by the reduced area of the second gate layer BL. In other words, as at least a portion of the second transparent electrode layer TL2 overlaps the first transparent electrode layer TL1, the area of the second gate layer BL overlapping the first transparent electrode layer TL1 perpendicularly to the substrate 100 may be reduced.

Some of the edges of the second transparent electrode layer TL2 may be covered by the second gate layer BL. In other words, the second gate layer BL may cover some of the edges of the second transparent electrode layer TL2, because the second transparent electrode layer TL2 is first formed and then the second gate layer BL electrically connected to the second transparent electrode layer TL2 is formed.

The second transparent electrode layer TL2 may be formed simultaneously with a second sub-transparent electrode layer located in the component area CA of the display apparatus. In other words, the display apparatus may not only include the second transparent electrode layer TL2 located in the display area, but may also further include the second sub-transparent electrode layer located in the component area CA, located on a same layer as the second transparent electrode layer TL2, and including the same material as the second transparent electrode layer TL2. Because the wiring of the component area CA is made of a transparent electrode material, the second transparent electrode layer TL2 may be formed simultaneously with transparent wiring such as the second sub-transparent electrode layer of the component area CA. As such, because the second transparent electrode layer TL2 and the transparent wiring such as the second sub-transparent electrode layer of the component region CA are simultaneously formed, the second transparent electrode layer TL2 may be easily formed without an additional process or mask.

For reference, some of the reference numerals shown in FIG. 6 will now be described with reference to FIGS. 9 through 15.

Figure 7:
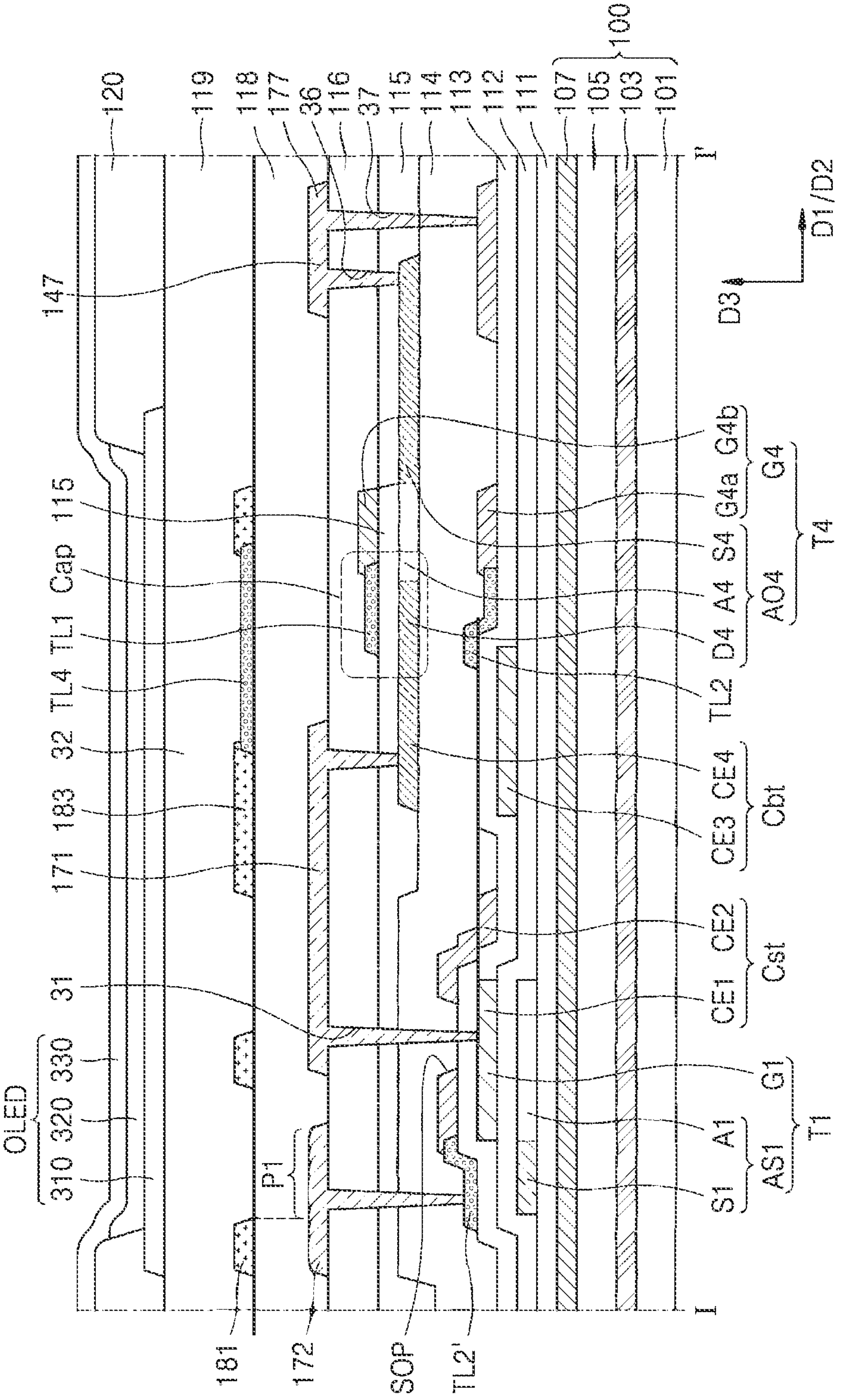
FIG. 7 is a schematic cross-sectional view taken along line I-I' of FIG. 5.

FIG. 7 is a schematic cross-sectional view taken along line I-I' of FIG. 5. An example shown in FIG. 7 may replace the example shown in FIG. 6, or may coexist with the example shown in FIG. 6. For reference, the same or overlapping matters in the description of FIG. 6 as those described above may be omitted, and only differences therebetween may be described.

For reference, FIG. 7 shows cross-sections of portions corresponding to the first transistor T1, the fourth transistor T4, the first capacitor Cst, the second capacitor Cbt, and the organic light-emitting diode OLED, and some members may be omitted.

A second' transparent electrode layer TL2' may be located on a same layer as the second gate layer BL and may include the same material as the first transparent electrode layer TL1. When viewed in the direction perpendicular to the substrate 100, the second transparent electrode layer TL2' may overlap at least a portion of the first semiconductor layer SL1. When viewed in the direction perpendicular to the substrate 100, the second' transparent electrode layer TL2' may be spaced apart from the second transparent electrode layer TL2. In a view in the direction perpendicular to the substrate 100, a portion of the second gate layer BL may be located between the second transparent electrode layer TL2 and the second' transparent electrode layer TL2'.

For convenience of description, the second' transparent electrode layer TL2' may be variously referred to as a 1-4$^{th}$ transparent electrode layer, a 2-4$^{th}$ transparent electrode layer, a 3-5$^{th}$ transparent electrode layer, and the like. In this specification, the second' transparent electrode layer TL2' may be defined as a transparent electrode layer arranged on a same layer as the layer on which the second gate layer BL is arranged, the transparent electrode layer being spaced apart from the second transparent electrode layer TL2.

Some of the edges of the second' transparent electrode layer TL2' may be covered by the second gate layer BL. In other words, the second gate layer BL may cover some of the edges of the second' transparent electrode layer TL2' because the second' transparent electrode layer TL2' is formed first and then the second gate layer BL electrically connected to the second' transparent electrode layer TL2' is formed.

The second' transparent electrode layer TL2' may be formed simultaneously with the second sub-transparent electrode layer located in the component area CA of the display apparatus. In other words, the display apparatus may include not only the second' transparent electrode layer TL2' located in the display area, but also the second sub-transparent electrode layer located in the component area CA, located on a same layer as the second' transparent electrode layer TL2', and including the same material as the second' transparent electrode layer TL2'. Because the wiring of the component area CA is made of a transparent electrode material, the second' transparent electrode layer TL2' may be formed simultaneously with the transparent wiring of the component area CA. As such, because the second' transparent electrode layer TL2' and the transparent wiring of the component region CA are simultaneously formed, the second' transparent electrode layer TL2' may be easily formed without an additional process or mask.

As such, the display apparatus according to some embodiments may have a high transmittance by including the second' transparent electrode layer TL2' overlapping the first semiconductor layer SL1 in the direction perpendicular to the substrate 100. In other words, the second' transparent electrode layer TL2' may replace a portion of the existing second gate layer BL located on the first semiconductor layer SL1, and accordingly, transmittance of the display apparatus according to some embodiments may be relatively improved.

The fourth transparent electrode layer TL4 may be located on a same layer as the second conductive layer SD2, and may include the same material as the first transparent electrode layer TL1. In a view in the direction perpendicular to the substrate 100, the fourth transparent electrode layer TL4 may overlap at least a portion of the first transparent electrode layer TL1.

In a view in the direction perpendicular to the substrate 100, the fourth transparent electrode layer TL4 may overlap at least a portion of the first transparent electrode layer TL1 and at least a portion of the second transparent electrode layer TL2. As at least a portion of the fourth transparent electrode layer TL4 overlaps the first transparent electrode layer TL1, the transmittance of the display apparatus may be increased. In some cases, the fourth transparent electrode layer TL4 may be omitted.

In other words, light radiated from a bottom of the substrate 100 toward a top of the substrate 100 may be simultaneously transmitted by the first transparent electrode layer TL1 and the fourth transparent electrode layer TL4. The light radiated from the bottom of the substrate 100 toward the top of the substrate 100 may be simultaneously transmitted by the first transparent electrode layer TL1, the second transparent electrode layer TL2, and the fourth transparent electrode layer TL4.

For reference, some of the reference numerals shown in FIG. 7 will now be described with reference to FIGS. 9 through 15.

Figure 8:
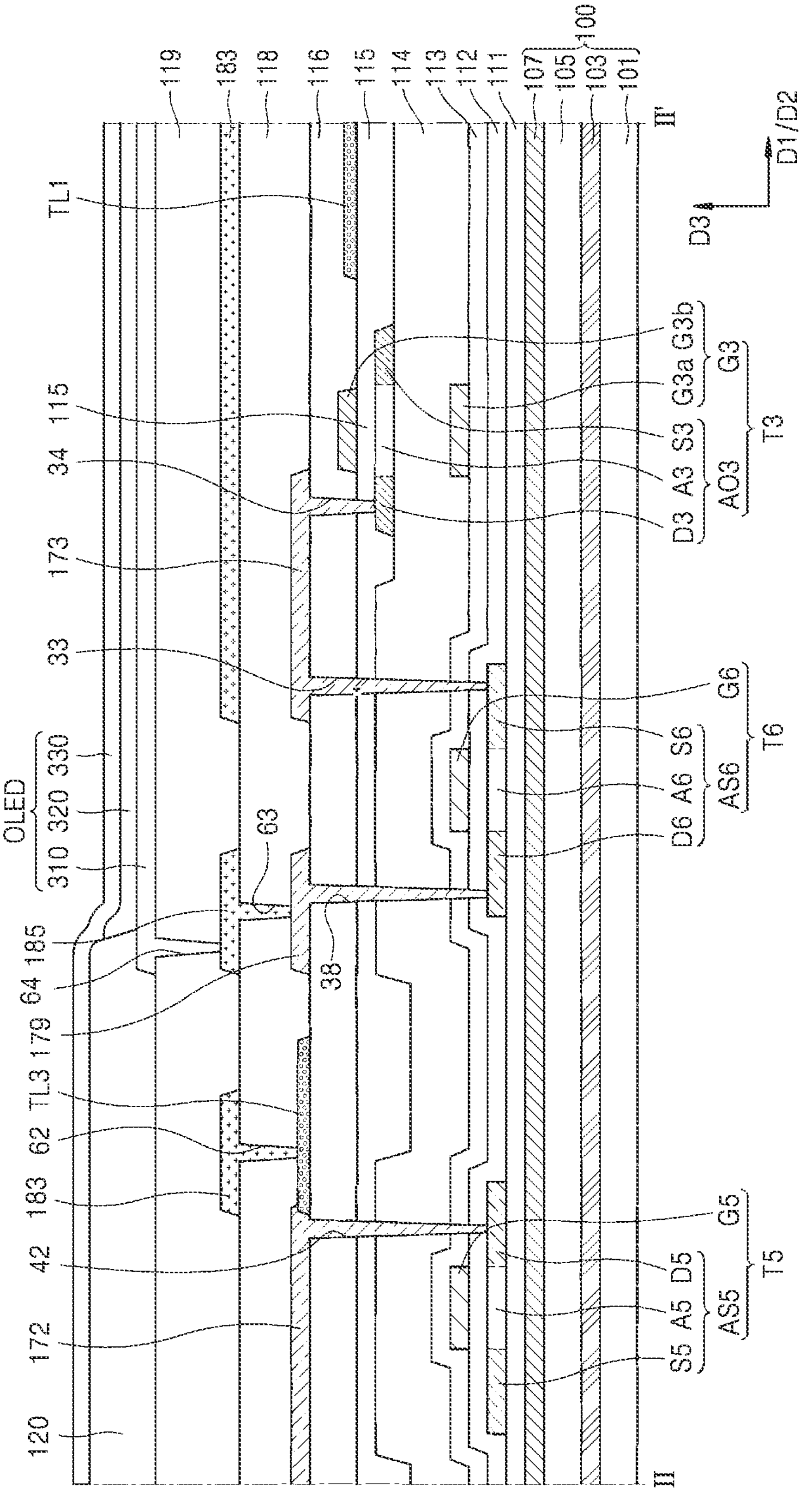
FIG. 8 is a schematic cross-sectional view taken along line II-II' of FIG. 5.

FIG. 8 is a schematic cross-sectional view taken along line II-II' of FIG. 5. In the description of FIG. 8, the same or overlapping matters as those described above may be omitted.

For reference, FIG. 8 shows cross-sections of portions corresponding to the third transistor T3, the fifth transistor T5, the sixth transistor T6, and the organic light-emitting diode OLED, and some members may be omitted.

The third transparent electrode layer TL3 may be arranged on a same layer as the layer on which the first conductive layer SD1 is arranged. When viewed in the direction perpendicular to the substrate 100, the third transparent electrode layer TL3 may include a first region that does not overlap the first gate layer GL1, the third gate layer GL2, and the second gate layer BL. In other words, the display apparatus according to some embodiments may include a third transparent electrode layer TL3 including the first region that does not overlap the first gate layer GL1, the third gate layer GL2, and the second gate layer BL, in order to have a certain level of transmittance. At least some of the edges of the third transparent electrode layer TL3 may be covered by the first conductive layer SD1.

For convenience of description, the third transparent electrode layer TL3 may be called variously. In this specification, the third transparent electrode layer TL3 is a transparent electrode layer located on a same layer as the first conductive layer SD1, and may refer to a configuration spaced apart from a third' transparent electrode layer TL3' to be described later. In a view in the direction perpendicular to the substrate 100, the third transparent electrode layer TL3 may not overlap the second' transparent electrode layer TL2'.

The third transparent electrode layer TL3 may be electrically connected to a first power supply voltage line that transmits a power supply voltage to a first transistor. As the third transparent electrode layer TL3 is connected to the first power supply voltage line, a coupling phenomenon occurring in the third transistor T3 or the fourth transistor T4 may be prevented or minimized. The coupling phenomenon may refer to a phenomenon in which the third transistor T3 or the fourth transistor T4 is affected by the data line 181 located on the third transparent electrode layer TL3. As such, because the third transparent electrode layer TL3 is formed on the wiring having a relatively high voltage, the effect of resistance that may be generated due to bonding of a transparent electrode material with metal wiring may be minimized.

The third transparent electrode layer TL3 may be formed simultaneously with a third sub-transparent electrode layer located in the component area CA of the display apparatus. In other words, the display apparatus may not only include the third transparent electrode layer TL3 located in the display area, but may also further include the third sub-transparent electrode layer located in the component area CA, located on a same layer as the third transparent electrode layer TL3, and including the same material as the third transparent electrode layer TL3. Because the wiring of the component area CA is made of a transparent electrode material, the third transparent electrode layer TL3 may be formed simultaneously with transparent wiring such as the third sub-transparent electrode layer of the component area CA. As such, because the third transparent electrode layer TL3 and the transparent wiring such as the third sub-transparent electrode layer of the component region CA are simultaneously formed, the third transparent electrode layer TL3 may be easily formed without an additional process or mask.

The fourth transparent electrode layer TL4 may be arranged on a same layer as the layer on which the second conductive layer SD2 is arranged. When viewed in the direction perpendicular to the substrate 100, the fourth transparent electrode layer TL4 may include a second region that does not overlap the first gate layer GL1, the third gate layer GL2, the second gate layer BL, and the first conductive layer SD1. In other words, the display apparatus according to some embodiments may include the fourth transparent electrode layer TL4 including the first region that does not overlap the first gate layer GL1, the third gate layer GL2, the second gate layer BL, and the first conductive layer SD1, in order to have a certain level of transmittance. At least some of the edges of the fourth transparent electrode layer TL4 may be covered by the second conductive layer SD2.

The fourth transparent electrode layer TL4 may be electrically connected to a second power supply voltage line that is electrically connected to a first power supply voltage line that transmits a power supply voltage to a first transistor. As a result, the fourth transparent electrode layer TL4 may be electrically connected to the first power voltage line. As such, because the fourth transparent electrode layer TL4 is formed on the wiring having a relatively high voltage, the effect of resistance that may be generated due to bonding of a transparent electrode material with metal wiring may be minimized.

The fourth transparent electrode layer TL3 may be formed simultaneously with a fourth sub-transparent electrode layer located in the component area CA of the display apparatus. In other words, the display apparatus may not only include the fourth transparent electrode layer TL4 located in the display area, but may also further include the fourth sub-transparent electrode layer located in the component area CA, located on a same layer as the fourth transparent electrode layer TL4, and including the same material as the fourth transparent electrode layer TL4. Because the wiring of the component area CA is made of a transparent electrode material, the fourth transparent electrode layer TL4 may be formed simultaneously with transparent wiring such as the fourth sub-transparent electrode layer of the component area CA. As such, because the fourth transparent electrode layer TL4 and the transparent wiring such as the fourth sub-transparent electrode layer of the component region CA are simultaneously formed, the fourth transparent electrode layer TL4 may be easily formed without an additional process or mask.

In this case, when viewed in the direction perpendicular to the substrate 100, the area of a region where the first region and the second region intersect may have a preset size. For example, the preset size may be 5 5 ($\mu m^2$).

Figure 9:
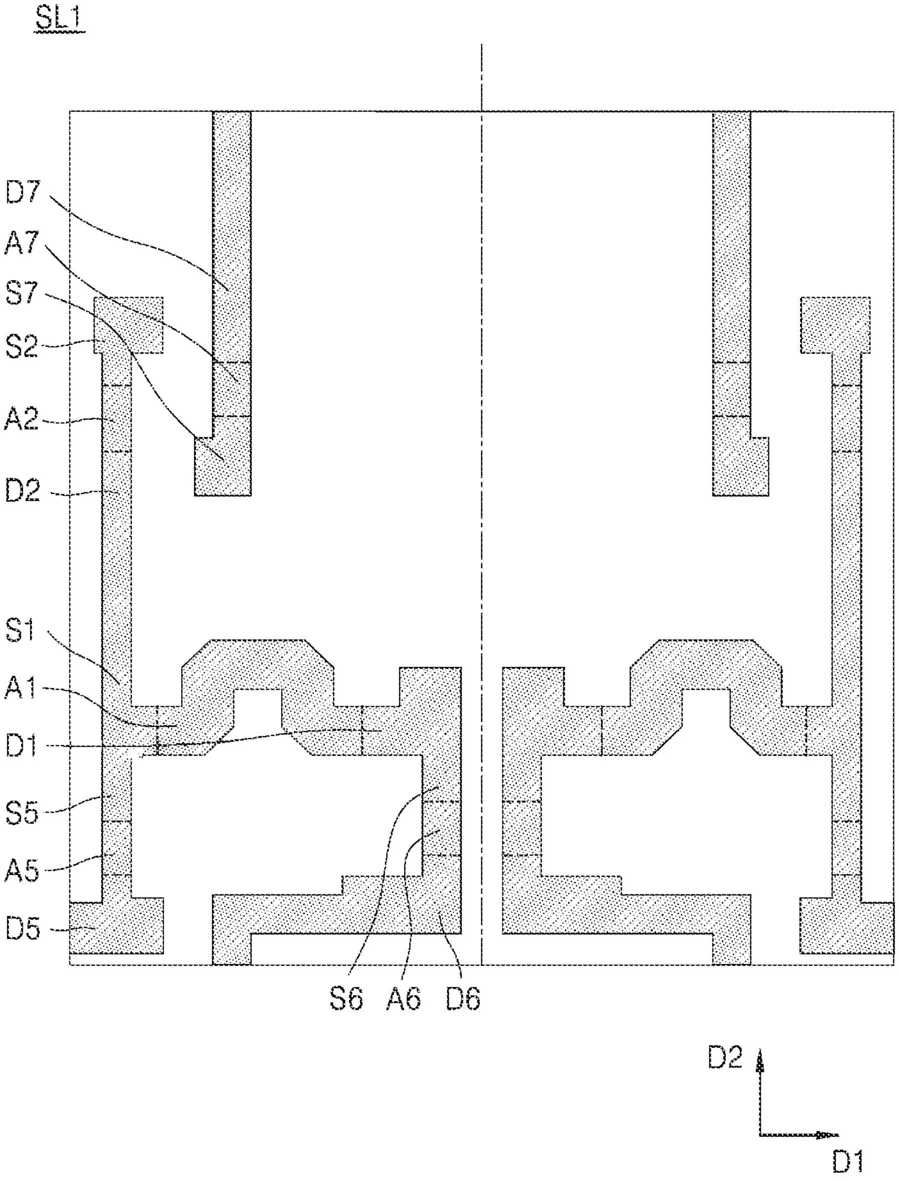
FIG. 9 is a schematic plan view of a first semiconductor layer of FIG. 5.

FIG. 9 is a schematic plan view of the first semiconductor layer SL1 of FIG. 5.

As shown in FIG. 9, the first semiconductor layer SL1 may be located on the substrate 100 and may include a silicon semiconductor. The first semiconductor layer SL1 may include channel regions A1, A2, A5, A6, and A7, source regions S1, S2, S5, S6, and S7, and drain regions D1, D2, D5, D6, and D7. In detail, the first semiconductor layer SL1 may include the channel region A1, the source region S1, and the drain region D1 of the first transistor T1. The first semiconductor layer SL1 may include the channel region A2, the source region S2, and the drain region D2 of the second transistor T2. In other words, the first semiconductor layer SL1 may be located on the substrate 100, may include a silicon semiconductor, and may include the first source region S1 and the first channel region A1 connected to the first source region S1.

Figure 10:
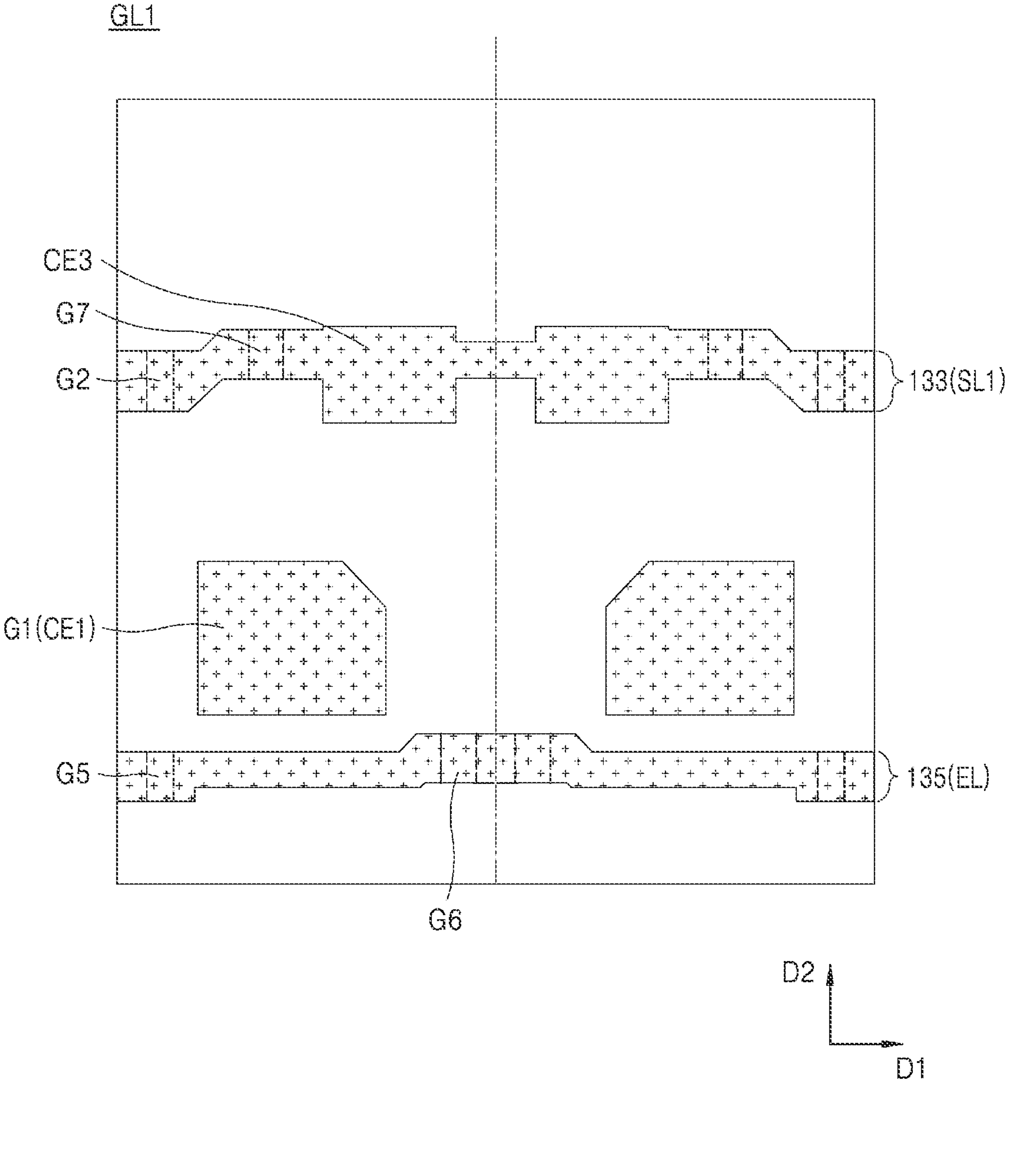
FIG. 10 is a schematic plan view of a first gate layer of FIG. 5.

FIG. 10 is a schematic plan view of the first gate layer GL1 of FIG. 5.

As shown in FIG. 10, the first gate layer GL1 may be located on the first semiconductor layer SL1 and may be insulated from the first semiconductor layer SL1. In other words, the above-described first interlayer insulating layer 112 may be located between the first gate layer GL1 and the first semiconductor layer SL1.

The first gate layer GL1 may include a plurality of gate electrodes G1, G2, G5, G6, and G7 used in thin film transistors. The first gate layer GL1 may include the gate electrode G1 of the first transistor T1, the gate electrode G2 of the second transistor T2, the gate electrode G5 of the fifth transistor T5, the gate electrode G6 of the sixth transistor T6, and the gate electrode G7 of the seventh transistor T7. In the first gate layer GL1, the first scan line 133 and the emission control line 135 may each extend in the first direction D1. A portion of the first scan line 133 may be the third electrode CE3 of the second capacitor Cbt.

The gate electrode G1 of the first transistor T1 may be provided in an island type. The gate electrode G1 of an island type may function as the first electrode CE1 of the first capacitor Cst. In other words, the gate electrode G1 may be the first electrode CE1 of the first capacitor Cst.

The gate electrode G2 of the second transistor T2 may be a portion of the first scan line 133 intersecting a semiconductor layer AS. The gate electrode G7 of the seventh transistor T7 may be a portion of the first scan line 133 intersecting the semiconductor layer AS or a portion of the second scan line 133' of FIG. 5, which is a first scan line in a next row.

FIG. 10 illustrates an example in which the gate electrode G7 of the seventh transistor T7 of a pixel located in a previous row is the portion of the first scan line 133 intersecting the semiconductor layer AS. The gate electrode G5 of the fifth transistor T5 and the gate electrode G6 of the sixth transistor T6 may be portions of the emission control line 135 intersecting the semiconductor layer AS.

The first gate electrode G1 of the first transistor T1 may not only function as a control electrode of the first transistor T1 but also function as the first electrode CE1 of the first capacitor Cst.

Figure 11:
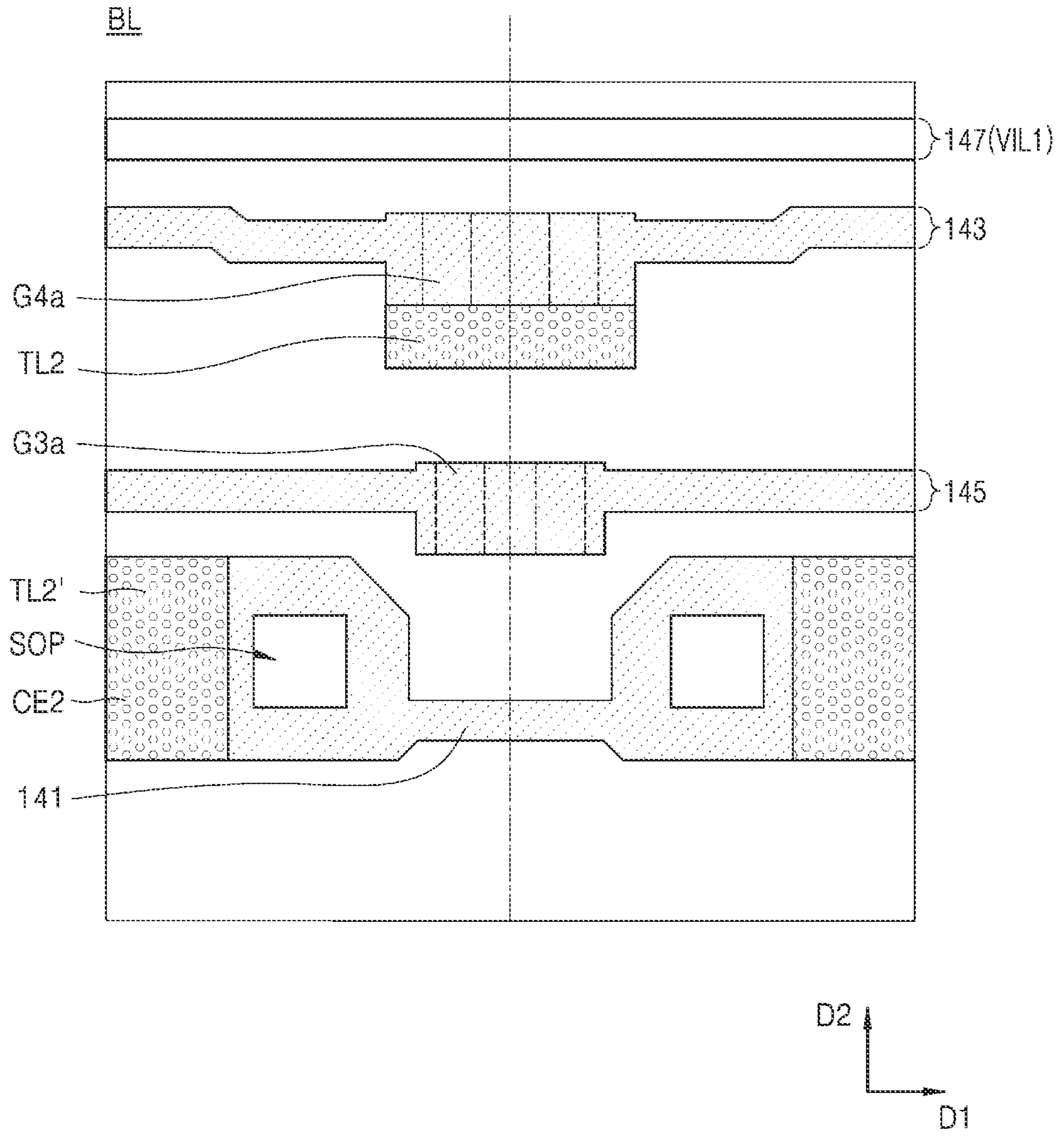
FIG. 11 is a schematic plan view of a shielding layer and a second transparent electrode layer of FIG. 5.

FIG. 11 is a schematic plan view of a shielding layer and the second transparent electrode layer TL2 of FIG. 5.

As shown in FIG. 11, the second gate layer BL may be located on the first gate layer GL1 and may include the second electrode CE2 of the first capacitor Cst. The second electrode CE2 of the first capacitor Cst may be arranged to overlap the first electrode CE1 when viewed in the direction perpendicular to the substrate 100. The second electrode CE2 may include an opening SOP. The opening SOP is formed by removing a portion of the second electrode CE2, and thus may have a closed shape when viewed in the direction perpendicular to the substrate 100.

Second electrodes CE2 of neighboring pixels may be connected to each other by a bridge 141. The bridge 141 is a protrusion from the second electrode CE2 in the first direction D1, and thus may be integrated with the second electrode CE2.

The second electrode CE2 of the first capacitor Cst may be formed of at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) in a single-layered or multi-layered structure.

The second gate layer BL may include the first initialization voltage line 147, the lower scan line 143 of the third scan line SCL3, and the lower scan line 145 of the fourth scan line SCL4. The first initialization voltage line 147, the lower scan line 143 of the third scan line SCL3, and the lower scan line 145 of the fourth scan line SCL4 may include the same material as the second electrode CE2 of the first capacitor Cst, and may each extend in the first direction D1.

A portion of the lower scan line 143 of the third scan line SCL3 overlapping a semiconductor layer AO may be a lower gate electrode G4*a* of the fourth transistor T4. A portion of the lower scan line 145 of the fourth scan line SCL4 overlapping the semiconductor layer AO may be a lower gate electrode G3*a* of the third transistor T3.

The second transparent electrode layer TL2 may be located on a same layer as the second gate layer BL and may include the same material as the first transparent electrode layer TL1. In a view in the direction perpendicular to the substrate 100, the second transparent electrode layer TL2 may overlap at least a portion of the first transparent electrode layer TL1. In some cases, the second transparent electrode layer TL2 may be omitted.

As at least a portion of the second transparent electrode layer TL2 overlaps the first transparent electrode layer TL1, the area of the second gate layer BL may be reduced. A transmittance of the display apparatus according to some embodiments may increase by the reduced area of the second gate layer BL. In other words, as at least a portion of the second transparent electrode layer TL2 overlaps the first transparent electrode layer TL1, the area of the second gate layer BL overlapping the first transparent electrode layer TL1 perpendicularly to the substrate 100 may be reduced.

The second transparent electrode layer TL2 may be connected to the lower gate electrode G4*a*. In detail, an edge adjacent to the lower gate electrode G4*a* among the edges of the second transparent electrode layer TL2 may be covered by the lower gate electrode G4*a*, because the second transparent electrode layer TL2 is first formed and then the second gate layer BL electrically connected to the second' transparent electrode layer TL2' is formed.

The second' transparent electrode layer TL2' may be located on a same layer as the second gate layer BL and may include the same material as the first transparent electrode layer TL1. When viewed in the direction perpendicular to the substrate 100, the second' transparent electrode layer TL2' may at least partially overlap the fifth source region S5 and the fifth channel region A5 of the first semiconductor layer SL1.

Some of the edges of the second' transparent electrode layer TL2' may be covered by the second gate layer BL. In other words, the second gate layer BL may cover some of the edges of the second' transparent electrode layer TL2' because the second' transparent electrode layer TL2' is formed first and then the second gate layer BL electrically connected to the second' transparent electrode layer TL2' is formed.

For example, the display apparatus according to some embodiments may include a capacitance Cap using a second' semiconductor layer SL2' as one electrode and a portion of the first gate layer GL1 as another electrode.

For example, the display apparatus according to some embodiments may further include a second capacitor unit including a 2-1 electrode and a 2-2 electrode insulated from the 2-1 electrode. The second capacitor unit may constitute the above-described capacitance Cap. In this case, the 2-1 electrode may be the second' semiconductor layer SL2' or a portion of the second' semiconductor layer SL2'. The 2-2 electrode may be a portion of the first gate layer GL1. In order to configure the capacitance Cap, the 2-1 electrode and the 2-2 electrode may overlap each other when viewed in the direction perpendicular to the substrate 100. A portion of the first gate layer GL1 may be the gate electrode G1 of FIG. 10.

For example, the display apparatus according to some embodiments may include a capacitance Cap using a portion of the second semiconductor layer SL2 as one electrode and the second transparent electrode layer TL2 as another electrode.

For example, the display apparatus according to some embodiments may further include a third capacitor unit including a 3-1 electrode and a 3-2 electrode insulated from the 3-1 electrode. The third capacitor unit may constitute the above-described capacitance Cap. In this case, the 3-1 electrode may be the second transparent electrode layer TL2 or a portion of the second transparent electrode layer TL2. The 3-2 electrode may be a portion of the second semiconductor layer SL2. In order to configure the capacitance Cap, the 3-1 electrode and the 3-2 electrode may overlap each other when viewed in the direction perpendicular to the substrate 100.

Figure 12:
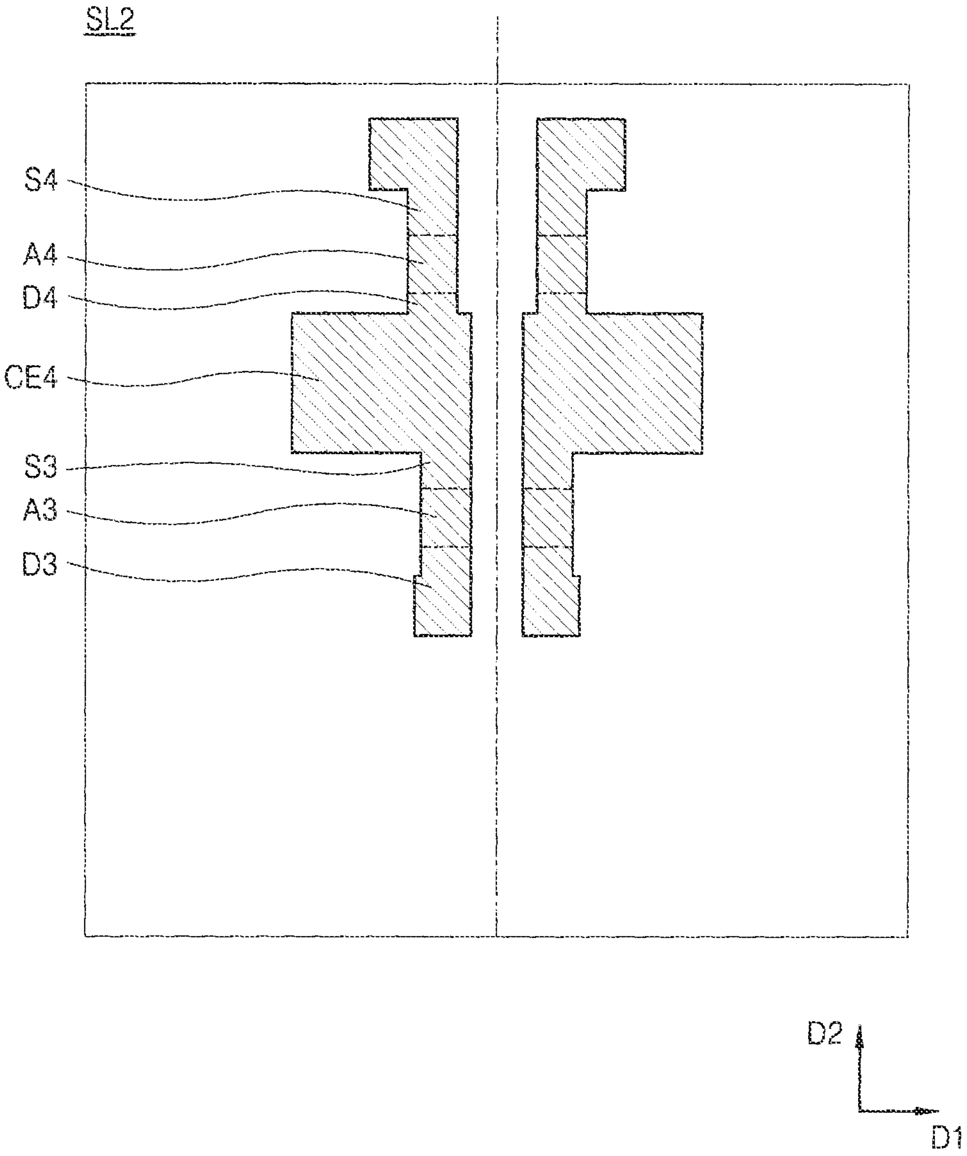
FIG. 12 is a schematic plan view of a second semiconductor layer of FIG. 5.

FIG. 12 is a schematic plan view of the second semiconductor layer SL2 of FIG. 5.

As shown in FIG. 12, the second semiconductor layer SL2 may be located on the second gate layer BL. The second semiconductor layer SL2 may include Zn oxide, In—Zn oxide, Ga—In—Zn oxide, or the like as a Zn oxide-based material. According to some embodiments, the semiconductor layer AO may include an In—Ga—Zn—O (IGZO), In—Sn—Zn—O (ITZO), or In—Ga—Sn—Zn—O (IGTZO) semiconductor containing a metal, such as indium (In), gallium (Ga), or tin (Sn), in ZnO.

The second semiconductor layer SL2 may include the channel regions A3 and A4, the source regions S3 and S4, and the drain regions D3 and D4. In detail, the second semiconductor layer SL2 may include the channel region A3, the source region S3, and the drain region D3 of the third transistor T3. The second semiconductor layer SL2 may also include the channel region A4, the source region S4, and the drain region D4 of the fourth transistor T4. In other words, the channel region, the source region, and the drain region of each of the third and fourth transistors T3 and T4 may be partial regions of the semiconductor layer AO. The source region S4 of the fourth transistor T4 may overlap the first initialization voltage line 147.

The respective source regions and the respective drain regions of the third and fourth transistors T3 and T4 may be formed by making an oxide semiconductor be conductive by controlling the carrier concentration of the oxide semiconductor. For example, the respective source regions and the respective drain regions of the third and fourth transistors T3 and T4 may be formed by increasing the carrier concentration of an oxide semiconductor by performing plasma processing on the oxide semiconductor by using a hydrogen (H)-based gas, a fluorine (F)-based gas, or a combination thereof.

The second semiconductor layer SL2 may include the fourth electrode CE4 of the second capacitor Cbt. The fourth electrode CE4 of the second capacitor Cbt may be positioned between the third sub-semiconductor layer AO3 of the third transistor T3 and the fourth sub-semiconductor layer AO4 of the fourth transistor T4. The fourth electrode CE4 may extend from the third sub-semiconductor layer AO3 of the third transistor T3 or the fourth sub-semiconductor layer AO4 of the fourth transistor T4. In other words, the fourth electrode CE4 may be formed of an oxide semiconductor and may be located on the third interlayer insulating layer 114.

Figure 13:
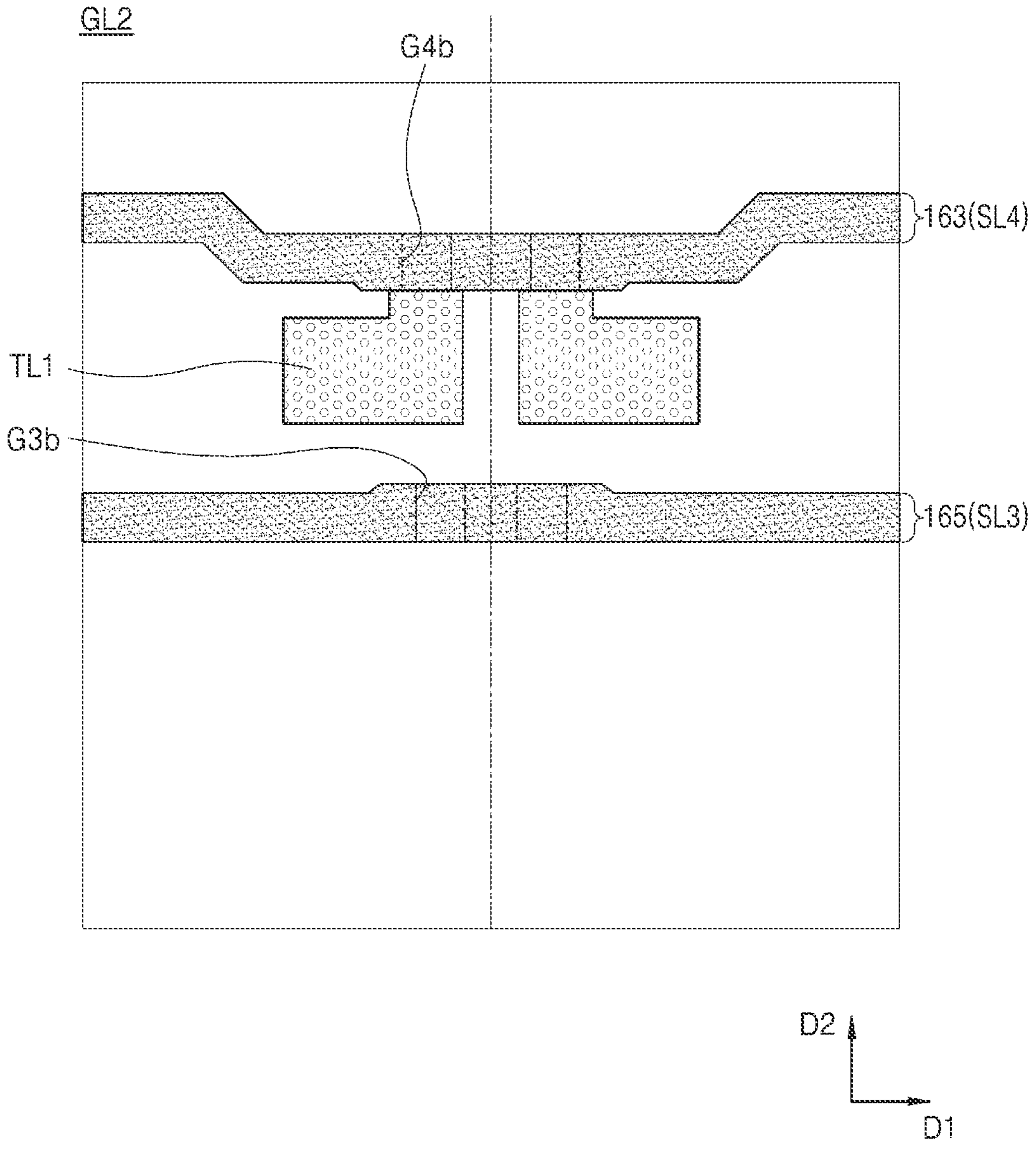
FIG. 13 is a schematic plan view of a third gate layer and a first transparent electrode layer of FIG. 5.

FIG. 13 is a schematic plan view of the third gate layer GL2 and the first transparent electrode layer TL1 of FIG. 5.

As shown in FIG. 13, the third gate layer GL2 may be located on the second semiconductor layer SL2. The third gate layer GL2 may be insulated from the second semiconductor layer SL2. The third gate layer GL2 may include the upper scan line 163 of the third scan line SCL3 and the upper scan line 165 of the fourth scan line SCL4. The upper scan line 163 of the third scan line SCL3 and the upper scan line 165 of the fourth scan line SCL4 in the third gate layer GL2 may each extend in the first direction D1. In other words, the third scan line SCL3 and the fourth scan line SCL4 may be provided as two conductive layers arranged on different layers.

The upper scan line 163 of the third scan line SCL3 may be arranged to at least partially overlap the lower scan line 143 when viewed in the direction perpendicular to the substrate 100. The upper scan line 165 of the fourth scan line SCL4 may be arranged to at least partially overlap the lower scan line 145. The fourth interlayer insulating layer 115 may be located between the semiconductor layer AO and the upper scan line 163 of the third scan line SCL3 and between the semiconductor layer AO and the upper scan line 165 of the fourth scan line SCL4. The fourth interlayer insulating layer 115 may be formed by being patterned in a shape corresponding to the upper scan line 163 of the third scan line SCL3 and the upper scan line 165 of the fourth scan line SCL4.

A portion of the upper scan line 163 of the third scan line SCL3 overlapping the fourth sub-semiconductor layer AO4 may be the upper gate electrode G4*b* of the fourth transistor T4. A portion of the upper scan line 165 of the fourth scan line SCL4 overlapping the third sub-semiconductor layer AO3 may be the upper gate electrode G3*b* of the third transistor T3. In other words, the third and fourth transistors T3 and T4 may each have a dual gate structure including control electrodes above and below a semiconductor layer, respectively.

The first transparent electrode layer TL1 may be arranged on a same layer as the layer on which the third gate layer GL2 is arranged. In a view in the direction perpendicular to the substrate 100, at least a portion of the first transparent electrode layer TL1 may overlap the fourth electrode CE4 of the second capacitor Cbt in the second semiconductor layer SL2.

The first transparent electrode layer TL1 may be connected to the upper gate electrode G4*b* of the fourth transistor T4. In other words, an edge adjacent to the upper gate electrode G4*b* of the fourth transistor T4 among the edges of the first transparent electrode layer TL1 may be covered by the upper gate electrode G4*b* of the fourth transistor T4.

The shape of the first transparent electrode layer TL1 may correspond to the shape of the fourth electrode CE4 of the second capacitor Cbt when viewed from the direction perpendicular to the substrate 100. In other words, the first transparent electrode layer TL1 may form a capacitance together with the fourth electrode CE4 of the second capacitor Cbt. To this end, the first transparent electrode layer TL1 may have a shape that is the same as or similar to the fourth electrode CE4 of the second capacitor Cbt. In other words, the shape of a region of the first transparent electrode layer TL1 corresponding to one electrode that forms a capacitance may correspond to the shape of a region of the second semiconductor layer SL2 corresponding to the fourth electrode CE4 of the second capacitor Cbt.

Figure 14:
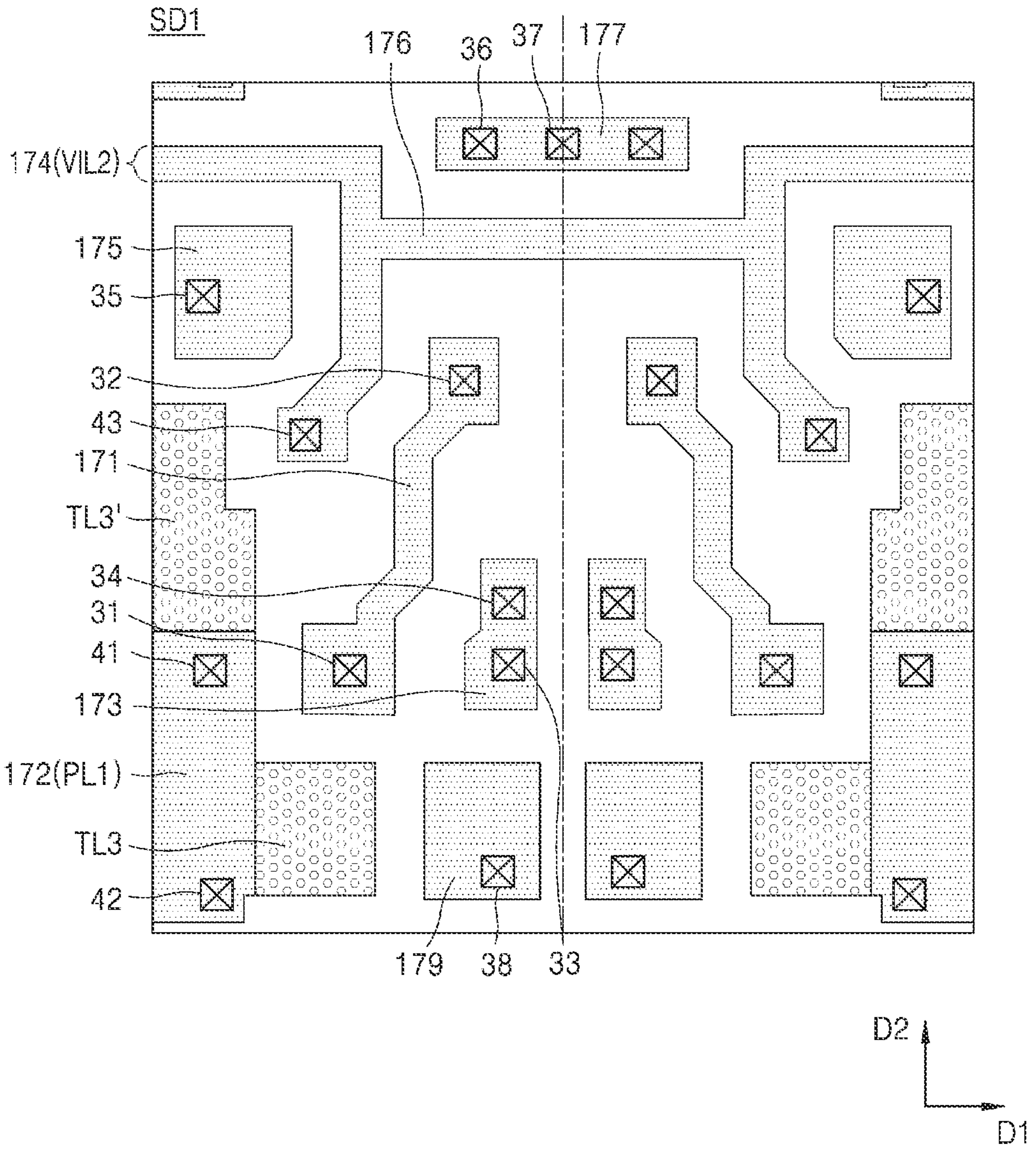
FIG. 14 is a schematic plan view of a first conductive layer, a third transparent electrode layer, and a third' transparent electrode layer of FIG. 5.

FIG. 14 is a schematic plan view of the first conductive layer SD1, the third transparent electrode layer TL3, and the third' transparent electrode layer TL3' of FIG. 5.

As shown in FIG. 14, the first conductive layer SD1 may be located on the third gate layer GL2. The first conductive layer SD1 may include the first power voltage line 172, the second initialization voltage line 174, the node connection line 171, and the connection electrodes 173, 175, 177, and 179.

The first power voltage line 172, the second initialization voltage line 174, the node connection line 171, and the connection electrodes 173, 175, 177, and 179 may include a highly-conductive material such as a metal or a conductive oxide. For example, the first power voltage line 172, the second initialization voltage line 174, the node connection line 171, and the connection electrodes 173, 175, 177, and 179 may each include a single layer or multiple layers including at least one of aluminum (Al), copper (Cu), titanium (Ti), etc. According to some embodiments, the first power voltage line 172, the second initialization voltage line 174, the node connection line 171, and the connection electrodes 173, 175, 177, and 179 may each include three layers of Ti/Al/Ti sequentially arranged.

The first power voltage line 172 may be connected to the second electrode CE2 of the first capacitor Cst through the contact hole 41 formed in the third interlayer insulating layer 114 and the fifth interlayer insulating layer 116. The first power voltage line 172 may be connected to the fifth drain region D5 of the fifth transistor T5 through the contact hole 42 formed in the first interlayer insulating layer 112, the second interlayer insulating layer 113, the third interlayer insulating layer 114, and the fifth interlayer insulating layer 116.

The second power voltage line 174 may be connected to the seventh drain region D7 of the seventh transistor T7 through the contact hole 43 formed in the first interlayer insulating layer 112, the second interlayer insulating layer 113, the third interlayer insulating layer 114, and the fifth interlayer insulating layer 116.

One end of the node connection line 171 may be connected to the first gate electrode G1 through the contact hole 31. The contact hole 31 may pass through the fifth interlayer insulating layer 116, the third interlayer insulating layer 114, and the second interlayer insulating layer 113, and may expose the first gate electrode G1. One end of the node connection line 171 may be inserted into the contact hole 31, and may be electrically connected to the first gate electrode G1.

The contact hole 31 may be spaced apart from the edge of the opening SOP of the second electrode CE2 within the opening SOP, and the node connection line 171 inserted into the contact hole 31 may be electrically isolated from the second electrode CE2.

The other end of the node connection line 171 may be connected to an oxide semiconductor layer, for example, the fourth electrode CE4 of the second capacitor Cbt, the fourth sub-semiconductor layer AO4, or the third sub-semiconductor layer AO3, through the contact hole 32. The contact hole 32 may pass through the fifth interlayer insulating layer 116 to expose the oxide semiconductor layer.

The fourth electrode CE4 of the second capacitor Cbt may be connected to the node connection line 171 and thus electrically connected to the first gate electrode G1. Accordingly, when the first scan signal Sn supplied to the first scan line SCL1 is turned off, the second capacitor Cbt may increase the voltage of the node N2 (see FIG. 4) to clearly express a black grayscale.

One end of the connection electrode 173 may be connected to the first drain region D1 of the first transistor T1 and the sixth source region S6 of the sixth transistor T6 through the contact hole 33. The contact hole 33 may pass through the first interlayer insulating layer 112, the second interlayer insulating layer 113, the third interlayer insulating layer 114, and the fifth interlayer insulating layer 116 to expose the silicon semiconductor layer. The other end of the connection electrode 173 may be connected to the third drain region D3 of the third transistor T3 through the contact hole 34. The contact hole 34 may pass through the fifth interlayer insulating layer 116 to expose the oxide semiconductor layer.

The connection electrode 175 may be connected to the second source region S2 of the second transistor T2 through the contact hole 35 formed in the first interlayer insulating layer 112, the second interlayer insulating layer 113, the third interlayer insulating layer 114, and the fifth interlayer insulating layer 116.

One end of the connection electrode 177 may be connected to the fourth source region S4 of the fourth transistor T4 through the contact hole 36 formed in the fifth interlayer insulating layer 116. The other end of the connection electrode 177 may be connected to the first initialization voltage line 174 through the contact hole 37 formed in the third interlayer insulating layer 114 and the fifth interlayer insulating layer 116.

The connection electrode 179 may be connected to the sixth drain region D6 of the sixth transistor T6 through the contact hole 38 formed in the first interlayer insulating layer 112, the second interlayer insulating layer 113, the third interlayer insulating layer 114, and the fifth interlayer insulating layer 116.

The third transparent electrode layer TL3 may be arranged on a same layer as the layer on which the first conductive layer SD1 is arranged. When viewed in the direction perpendicular to the substrate 100, the third transparent electrode layer TL3 may include a first region that does not overlap the first gate layer GL1, the third gate layer GL2, and the second gate layer BL.

The third transparent electrode layer TL3 may be connected to the first power supply voltage line 172. In a view in the direction perpendicular to the substrate 100, the third transparent electrode layer TL3 may extend from the first power supply voltage line 172 in the first direction D1. When viewed in the direction perpendicular to the substrate 100, a width of the third transparent electrode layer TL3 in the second direction D2 may be less than that of the first power supply voltage line 172 in the second direction D2.

The display apparatus according to some embodiments may further include the third' transparent electrode layer TL3'.

The third' transparent electrode layer TL3' may be arranged on a same layer as the layer on which the first conductive layer SD1 is arranged. In a view in the direction perpendicular to the substrate 100, the third' transparent electrode layer TL3' may overlap at least a portion of the first semiconductor layer SL1. In other words, in a view in the direction perpendicular to the substrate 100, the third' transparent electrode layer TL3' may overlap at least a portion of the first source region S1 of the first semiconductor layer SL1.

For convenience of description, the third' transparent electrode layer TL3' may be variously referred to as a $1\text{-}5^{th}$ transparent electrode layer, a $2\text{-}4^{th}$ transparent electrode layer, and the like. In this specification, the third' transparent electrode layer TL3' may be defined as a transparent electrode layer located on a same layer as the first conductive layer SD1, and may be spaced apart from the third' transparent electrode layer TL3' on the same plane. In a view in the direction perpendicular to the substrate 100, at least a portion of the third' transparent electrode layer TL3' may overlap the second' transparent electrode layer TL2'.

In other words, light radiated from the bottom of the substrate 100 toward the top of the substrate 100 may be simultaneously transmitted by the second' transparent electrode layer TL2' and the third' transparent electrode layer TL3'. Accordingly, transmittance of the display apparatus may increase.

The third' transparent electrode layer TL3' may be connected to the first power supply voltage line 172. In a view in the direction perpendicular to the substrate 100, the third' transparent electrode layer TL3' may extend from the first power supply voltage line 172 in the second direction D2. When viewed in the direction perpendicular to the substrate 100, a width of the third' transparent electrode layer TL3' in the first direction D1 may be less than or equal to that of the first power supply voltage line 172 in the first direction D1.

Figure 15:
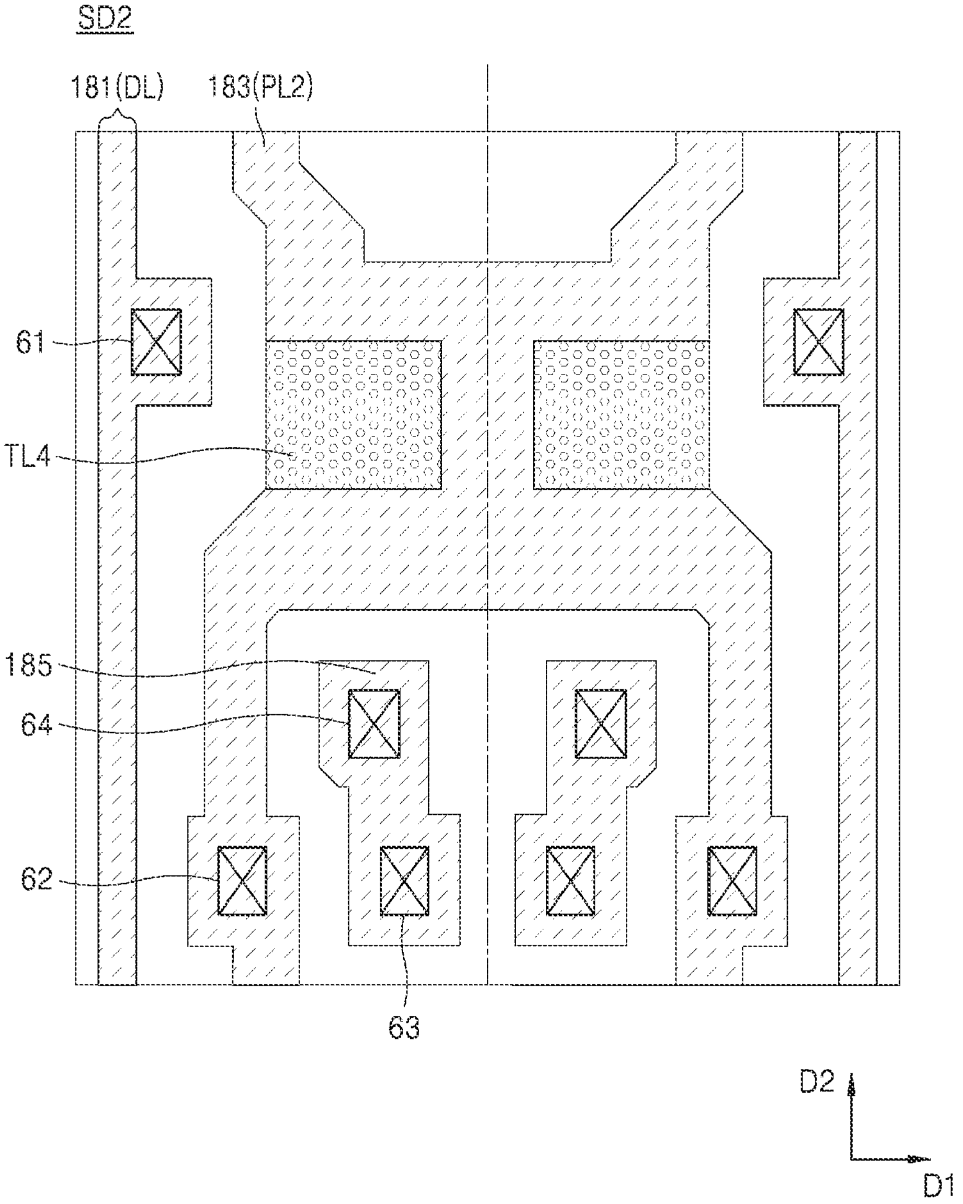
FIG. 15 is a schematic plan view of a second conductive layer and a fourth transparent electrode layer TL4 of FIG. 5.

FIG. 15 is a schematic plan view of the second conductive layer SD2 and the fourth transparent electrode layer TL4 of FIG. 5.

As shown in FIG. 15, the second conductive layer SD2 may be located on the first conductive layer SD1. The second conductive layer SD2 may include the data line 181, the second power supply voltage line 183, and the connection electrode 185. The data line 181 may be connected to the second source region S2 of the second transistor T2 by being connected to the connection electrode 175 through the contact hole 61 formed in the first organic insulating layer 118.

The data line 181 may be arranged to partially overlap the first power supply voltage line 172 when viewed in the direction perpendicular to the substrate 100. In a cross-sectional view, the first power supply voltage line 172 may be located between the first gate electrode G1 of the first transistor T1 and the data line DL. In a plan view, a partial region P1 of the first power supply voltage line 172 may be located between the data line 181 and the node connection line 171. Accordingly, the first power supply voltage line 172 may reduce coupling between the node connection line 171 and the first gate electrode G1 and between the node connection line 171 and the data line 181.

The second power supply voltage line 183 may be connected to the second transistor T2 through the contact hole 62 formed in the first organic insulating layer 118. The second power supply voltage line 183 may cover the third sub-semiconductor layer AO3 of the third transistor T3 or the fourth sub-semiconductor layer AO4 of the fourth transistor T4. Accordingly, the second power supply voltage line 183 may play a role of blocking light that may be applied from the top of the substrate 100. A portion of the second power supply voltage line 183 may overlap the node connection line 171. In a plan view, another portion of the second power supply voltage line 183 may be located between the data line 181 and the node connection line 171. Accordingly, the second power supply voltage line 183 may reduce coupling between the node connection line 171 and the data line 181.

The connection electrode 185 may be connected to the sixth drain region D6 of the sixth transistor T6 by being connected to the connection electrode 179 through the contact hole 63 formed in the first organic insulating layer 118. The connection electrode 185 may be connected to the pixel electrode 310 through the contact hole 64 formed in the second planarization layer 119 over the first organic insulating layer 118, and thus may transmit a signal applied through the sixth transistor T6 to the pixel electrode 310.

The fourth transparent electrode layer TL4 may be located on a same layer as the second conductive layer SD2, and may include the same material as the first transparent electrode layer TL1. In a view in the direction perpendicular to the substrate 100, the fourth transparent electrode layer TL4 may overlap at least a portion of the first transparent electrode layer TL1. In a view in the direction perpendicular to the substrate 100, the fourth transparent electrode layer TL4 may overlap at least a portion of the first transparent electrode layer TL1 and at least a portion of the second transparent electrode layer TL2. In some cases, the fourth transparent electrode layer TL4 may be omitted.

For convenience of description, the fourth transparent electrode layer TL4 may be variously referred to as a 1-3$^{rd}$ transparent electrode layer, a 2-2$^{nd}$ transparent electrode layer, a 3-2$^{nd}$ transparent electrode layer, and the like. In this specification, the fourth transparent electrode layer TL4 may be defined as a transparent electrode layer arranged on a same layer as the layer on which the second conductive layer SD2 is arranged. In a view in the direction perpendicular to the substrate 100, at least a portion of the fourth transparent electrode layer TL4 may overlap the first transparent electrode layer TL1.

Figure 16:
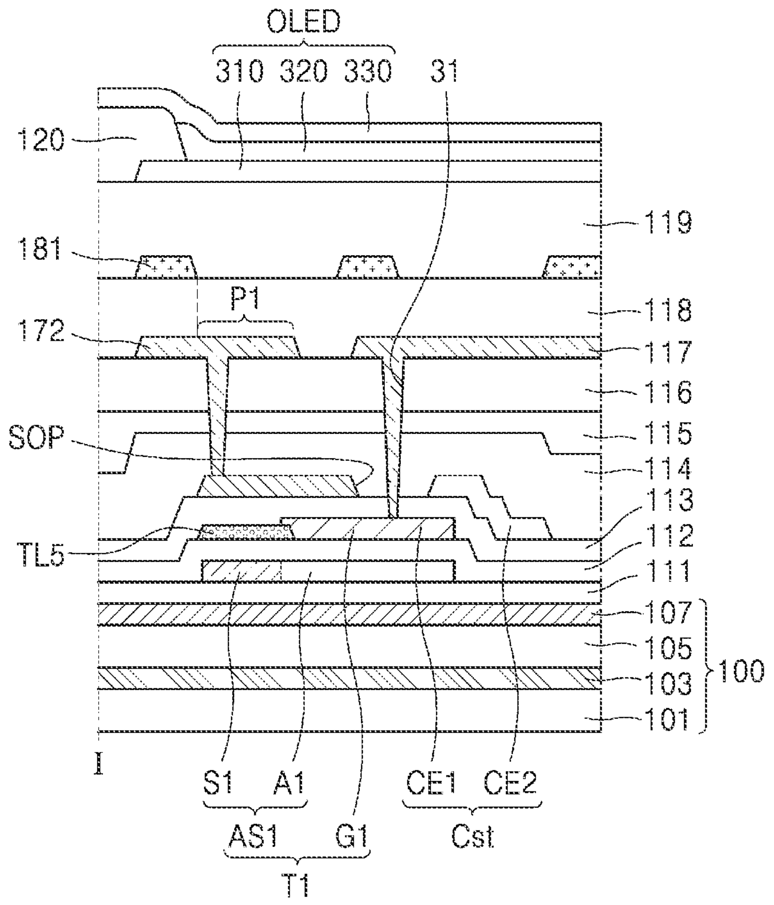
FIG. 16 is a schematic cross-sectional view mainly illustrating a first transistor of FIG. 5.

FIG. 16 is a schematic cross-sectional view mainly illustrating the first transistor T1 of FIG. 5. In the description of FIG. 16, the same or overlapping matters as those described above may be omitted.

As shown in FIG. 16, the fifth transparent electrode layer TL5 may be located on a same layer as the first gate layer GL1. In some cases, the fifth transparent electrode layer TL5 may be omitted. When the fifth transparent electrode layer TL5 is located, the first semiconductor layer SL1 may include an oxide semiconductor instead of a silicon semiconductor.

The fifth transparent electrode layer TL5 may be located on the first source region S1 of the first semiconductor layer SL1. In other words, when viewed in the direction perpendicular to the substrate 100, the fifth transparent electrode layer TL5 and the first source region S1 may overlap each other.

The fifth transparent electrode layer TL5 may be formed simultaneously with a fifth sub-transparent electrode layer located in the component area CA of the display apparatus. In other words, the display apparatus may not only include the fifth transparent electrode layer TL5 located in the display area, but may also further include the fifth sub-transparent electrode layer located in the component area CA, located on a same layer as the fifth transparent electrode layer TL5, and including the same material as the fifth transparent electrode layer TL5. Because the wiring of the component area CA is made of a transparent electrode material, the fifth transparent electrode layer TL5 may be formed simultaneously with transparent wiring such as the fifth sub-transparent electrode layer of the component area CA. As such, because the fifth transparent electrode layer TL5 and the transparent wiring such as the fifth sub-transparent electrode layer of the component region CA are simultaneously formed, the fifth transparent electrode layer TL5 may be easily formed without an additional process or mask.

According to some embodiments as described above, a display apparatus having relatively improved transmittance may be realized. Of course, the scope of embodiments according to the present disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
a substrate;
a first semiconductor layer on the substrate;
a first gate layer on the first semiconductor layer;
a second gate layer on the first gate layer;
a second semiconductor layer on the second gate layer;
a third gate layer on the second semiconductor layer;
a 1-1$^{st}$ transparent electrode layer on a same layer as the second gate layer; and
a 1-2$^{nd}$ transparent electrode layer on a same layer as the third gate layer and overlapping at least a portion of the 1-1$^{st}$ transparent electrode layer in a plan view.

2. The display apparatus of claim 1, further comprising:
a first conductive layer on the third gate layer;
a second conductive layer on the first conductive layer; and
a 1-3$^{rd}$ transparent electrode layer on a same layer as the second conductive layer.

3. The display apparatus of claim 2, wherein, in the plan view, the 1-3$^{rd}$ transparent electrode layer overlaps at least a portion of the 1-1$^{st}$ transparent electrode layer and at least a portion of the 1-2$^{nd}$ transparent electrode layer.

4. The display apparatus of claim 3, wherein light radiated from a bottom of the substrate toward a top of the substrate is simultaneously transmitted by the 1-1$^{st}$ transparent electrode layer, the 1-2$^{nd}$ transparent electrode layer and the 1-3$^{rd}$ transparent electrode layer.

5. The display apparatus of claim 3, further comprising a first capacitor unit including a 1-1$^{st}$ electrode and a 1-2$^{nd}$ electrode insulated from the 1-1$^{st}$ electrode,
wherein the 1-1$^{st}$ electrode is a portion of the 1-3$^{rd}$ transparent electrode layer, and the 1-2$^{nd}$ electrode is a portion of the second semiconductor layer.

6. The display apparatus of claim 1, further comprising a 1-4$^{th}$ transparent electrode layer on a same layer as the second gate layer and spaced apart from the 1-1$^{st}$ transparent electrode layer on a same plane.

7. The display apparatus of claim 6, further comprising:
a first conductive layer on the third gate layer;
a second conductive layer on the first conductive layer; and
a 1-5$^{th}$ transparent electrode layer on a same layer as the first conductive layer.

8. The display apparatus of claim 7, wherein, in the plan view, the 1-5$^{th}$ transparent electrode layer overlaps at least a portion of the 1-4$^{th}$ transparent electrode layer.

9. The display apparatus of claim 8, wherein light radiated from a bottom of the substrate toward a top of the substrate is simultaneously transmitted by the 1-4$^{th}$ transparent electrode layer and the 1-5$^{th}$ transparent electrode layer.

10. The display apparatus of claim 8, further comprising a second capacitor unit including a 2-1$^{st}$ electrode and a 2-2$^{nd}$ electrode insulated from the 2-1$^{st}$ electrode,
wherein the 2-1$^{st}$ electrode is a portion of the 1-4$^{th}$ transparent electrode layer, and the 2-2$^{nd}$ electrode is a portion of the first gate layer.

11. A display apparatus comprising:
a substrate;
a first semiconductor layer on the substrate;
a first gate layer on the first semiconductor layer;
a second gate layer on the first gate layer;
a second semiconductor layer on the second gate layer;
a third gate layer on the second semiconductor layer;
a 2-1$^{st}$ transparent electrode layer on a same layer as the third gate layer and overlapping a portion of the second semiconductor layer in a plan view; and
a first capacitor unit including a 1-1$^{st}$ electrode and a 1-2$^{nd}$ electrode insulated from the 1-1$^{st}$ electrode,
wherein the 1-1$^{st}$ electrode is at least a portion of the 2-1$^{st}$ transparent electrode layer, and the 1-2$^{nd}$ electrode is a portion of the second semiconductor layer.

12. The display apparatus of claim 11, further comprising:
a first conductive layer on the third gate layer;
a second conductive layer on the first conductive layer; and
a 2-2$^{nd}$ transparent electrode layer on a same layer as the second conductive layer and overlapping at least a portion of the 2-1$^{st}$ transparent electrode layer in the plan view.

13. The display apparatus of claim 11, further comprising a 2-3$^{rd}$ transparent electrode layer on a same layer as the second gate layer and overlapping at least a portion of the 2-1$^{st}$ transparent electrode layer in the plan view.

14. The display apparatus of claim 12, wherein light radiated from a bottom of the substrate toward a top of the substrate is simultaneously transmitted by the 2-1$^{st}$ transparent electrode layer and the 2-2$^{nd}$ transparent electrode layer.

15. The display apparatus of claim 13, wherein light radiated from a bottom of the substrate toward a top of the substrate is simultaneously transmitted by the 2-1$^{st}$ transparent electrode layer and the 2-3$^{rd}$ transparent electrode layer.

16. The display apparatus of claim 13, further comprising a 2-4$^{th}$ transparent electrode layer on a same layer as the second gate layer and spaced apart from the 2-3$^{rd}$ transparent electrode layer on a same plane.

17. The display apparatus of claim 16, further comprising a second capacitor unit including a 2-1$^{st}$ electrode and a 2-2$^{nd}$ electrode insulated from the 2-1$^{st}$ electrode,
wherein the 2-1$^{st}$ electrode is a portion of the 2-4$^{th}$ transparent electrode layer, and the 2-2$^{nd}$ electrode is a portion of the first gate layer.

18. A display apparatus comprising:
a substrate;
a first semiconductor layer on the substrate;
a first gate layer on the first semiconductor layer;
a second gate layer on the first gate layer;
a second semiconductor layer on the second gate layer;
a third gate layer on the second semiconductor layer;
a 3-1$^{st}$ transparent electrode layer on a same layer as the second gate layer and overlapping a portion of the second semiconductor layer in a plan view; and
a third capacitor unit including a 3-1$^{st}$ electrode and a 3-2$^{nd}$ electrode insulated from the 3-1$^{st}$ electrode,
wherein the 3-1$^{st}$ electrode is at least a portion of the 3-1$^{st}$ transparent electrode layer, and the 3-2$^{nd}$ electrode is a portion of the second semiconductor layer.

19. The display apparatus of claim 18, further comprising:
a first conductive layer on the third gate layer;
a second conductive layer on the first conductive layer; and
a 3-2$^{nd}$ transparent electrode layer on a same layer as the second conductive layer and overlapping at least a portion of the 3-1$^{st}$ transparent electrode layer in the plan view.

20. The display apparatus of claim 19, further comprising a 3-3$^{rd}$ transparent electrode layer on a same layer as the third gate layer and overlapping at least a portion of the 3-2$^{nd}$ transparent electrode layer in the plan view.

* * * * *